United States Patent
Ishizu et al.

(10) Patent No.: US 9,852,787 B2
(45) Date of Patent: *Dec. 26, 2017

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takahiko Ishizu, Kanagawa (JP); Kiyoshi Kato, Kanagawa (JP); Tatsuya Onuki, Kanagawa (JP); Wataru Uesugi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/464,395

(22) Filed: Mar. 21, 2017

(65) Prior Publication Data

US 2017/0194048 A1    Jul. 6, 2017

Related U.S. Application Data

(63) Continuation of application No. 14/659,914, filed on Mar. 17, 2015, now Pat. No. 9,627,010.

(30) Foreign Application Priority Data

Mar. 20, 2014 (JP) ................................. 2014-057459

(51) Int. Cl.
  *G11C 11/419* (2006.01)
  *G11C 5/14* (2006.01)
  (Continued)

(52) U.S. Cl.
  CPC ............ *G11C 11/419* (2013.01); *G06F 3/065* (2013.01); *G06F 3/0619* (2013.01); *G06F 3/0685* (2013.01); *G11C 14/0054* (2013.01)

(58) Field of Classification Search
  CPC .... G11C 5/147; G11C 11/409; G11C 11/4074
  See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A     9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Tri Hoang
(74) *Attorney, Agent, or Firm* — Fish & Richardson P.C.

(57) ABSTRACT

Provided is a semiconductor device having a memory cell array, which is capable of existing in three power-gating states depending on a non-access period to the memory cell array. The memory cell array includes a plurality of memory cells which each have an SRAM and a nonvolatile memory portion having a transistor with an oxide semiconductor in a channel region. The three power-gating states includes: a first state in which a power-gating to the memory cell array is performed; a second state in which the power-gating is performed on the memory cell array and peripheral circuits which control the memory cell array; and a third state in
(Continued)

which, in addition to the memory cell array and the peripheral circuits, a power supply voltage supplying circuit is subjected to the power gating.

24 Claims, 16 Drawing Sheets

(51) Int. Cl.
   *G06F 3/06* (2006.01)
   *G11C 14/00* (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,321,505 B2 * | 1/2008 | Noda | G11C 7/1045 365/154 |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,787,073 B2 | 7/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0191673 A1 | 7/2013 | Koyama et al. | |
| 2013/0223135 A1 * | 8/2013 | Koyama | G11C 11/412 365/149 |
| 2013/0297874 A1 | 11/2013 | Kurokawa | |
| 2013/0301331 A1 | 11/2013 | Onuki et al. | |
| 2013/0332763 A1 * | 12/2013 | Palaniappan | G11C 5/148 713/324 |
| 2014/0068300 A1 | 3/2014 | Nishijima et al. | |
| 2014/0328111 A1 | 11/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-009285 A | 1/2013 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

First state C3 (mode 1)

mode 1 Backup mode 1 Recovery

Second state C4 (mode 2)

mode 2 Backup mode 2 Recovery

Third state C5 (mode 3)

mode 3 Backup mode 3 Recovery

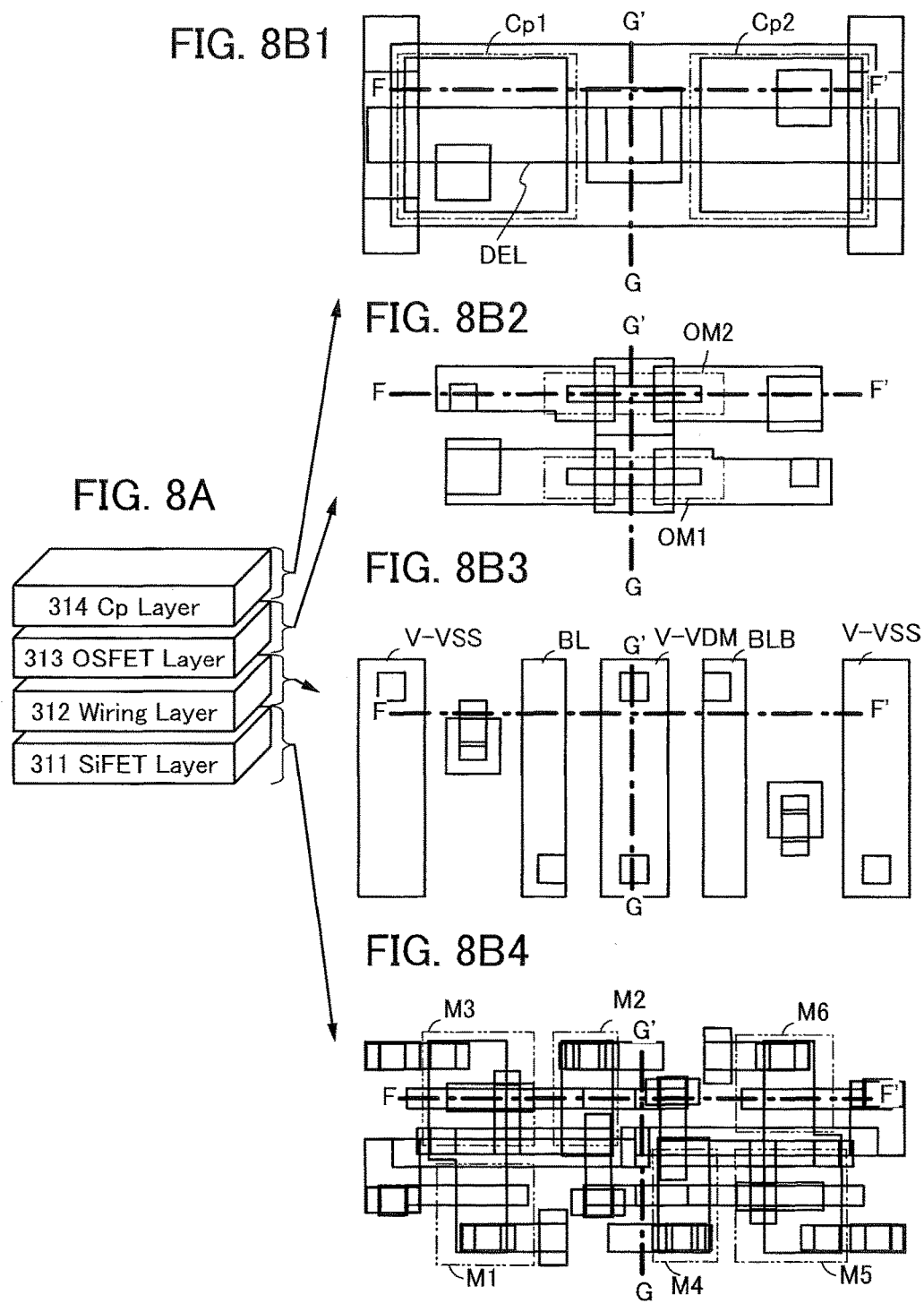

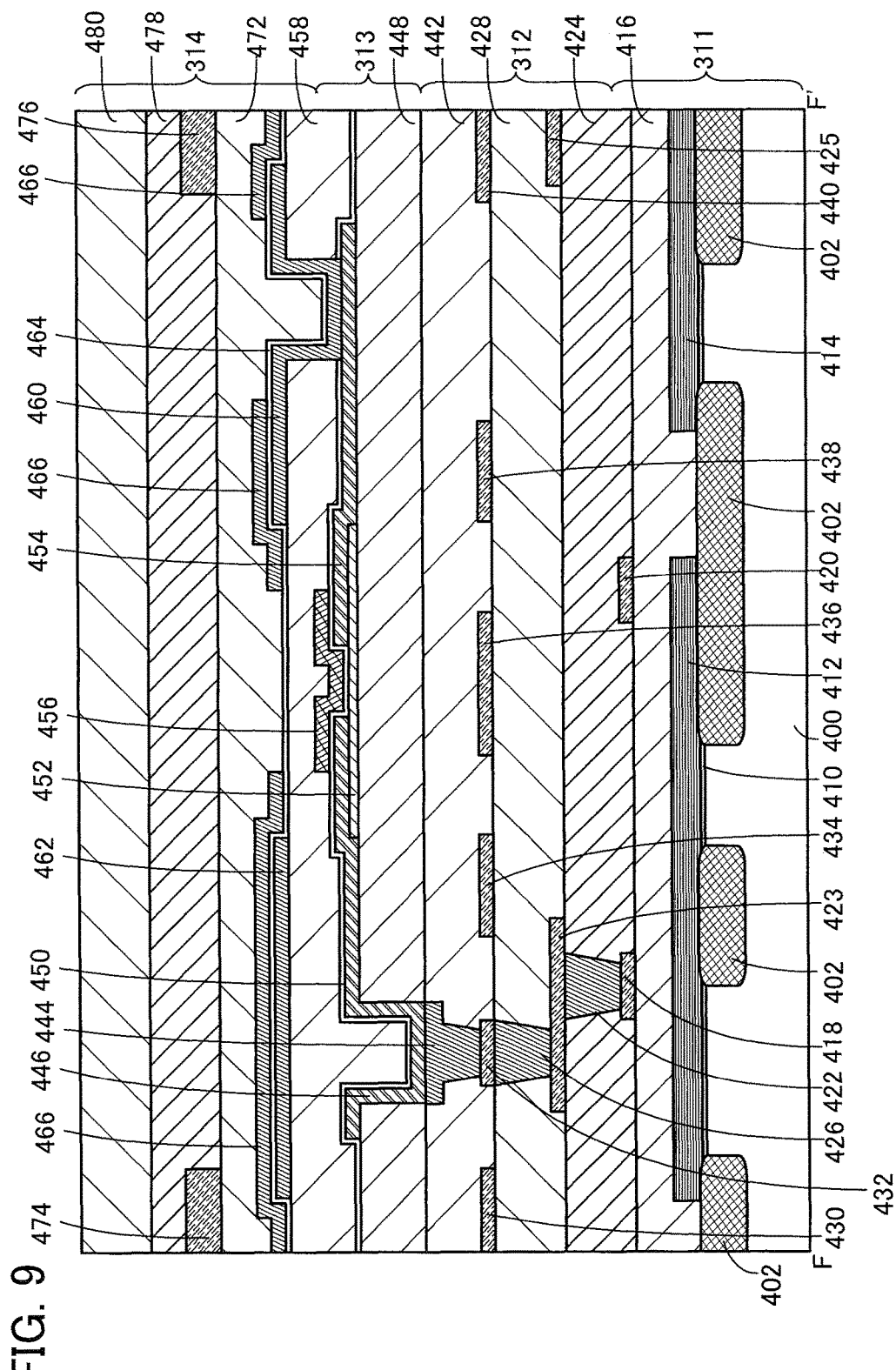

CAAC-OS nc-OS as-sputtered after 450 °C heating

SEMICONDUCTOR DEVICE, ELECTRONIC COMPONENT, AND ELECTRONIC DEVICE

CROSS-REFERENCE TO RELATED APPLICATIONS

This application is a continuation of U.S. application Ser. No. 14/659,914, filed Mar. 17, 2015, now U.S. Pat. No. 9,627,010, which claims the benefit of a foreign priority application filed in Japan as Serial No. 2014-057459 on Mar. 20, 2014, both of which are incorporated by reference.

BACKGROUND OF THE INVENTION

1. Field of the Invention

One embodiment of the present invention relates to a semiconductor device, an electronic component, and an electronic device.

Note that one embodiment of the present invention is not limited to the above technical field. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A static random access memory (SRAM) is used as a cache memory of a processor or the like because data writing/reading can be performed at high speed.

Since an SRAM is a volatile memory, data is lost when power supply is stopped. Therefore, the following structure is proposed: a transistor using an oxide semiconductor in a semiconductor layer in which a channel is formed (OS transistor) and a capacitor are added to an SRAM so that loss of data is prevented (see Patent Document 1, for example).

REFERENCE

Patent Document

[Patent Document 1] Japanese Published Patent Application No. 2013-9285

SUMMARY OF THE INVENTION

Further reduction in power consumption is required for the devices which are arranged to prevent loss of data.

An object of one embodiment of the present invention is to provide a novel semiconductor device or the like.

Another object of one embodiment of the present invention is to provide a semiconductor device or the like having a novel structure that achieves reduction in power consumption. Another object of one embodiment of the present invention is to provide a semiconductor device or the like having a novel structure that can achieve fine-grained power gating.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device which includes a memory cell array, a drive control circuit, a data control circuit, and first to third power switches; a power supply voltage control circuit; and a power supply voltage generation circuit. The memory cell includes a plurality of memory cells which each have a function that data writing and reading are controlled by the drive control circuit and a function of saving and restoring the data to a nonvolatile memory portion by control of the data control circuit. The power supply voltage control circuit has a function of controlling on and off of the first to third power switches. The power supply voltage generation circuit has a function of generating first to third power supply voltages, based on a reference voltage. The first power switch has a function of supplying the first power supply voltage to the memory cell. The second power switch has a function of supplying the second power supply voltage to the driver control circuit. The third power switch has a function of supplying the third power supply voltage to the data control circuit. The power supply voltage control circuit has a function of switching a first state where the first power switch is off, a second state where the first to third power switches are off, and a third state where generation of the first to third power supply voltages is stopped.

Note that other embodiments of the present invention will be described in the following embodiments with reference to the drawings.

According to one embodiment of the present invention, it is possible to provide a semiconductor device or the like having a novel structure.

According to another embodiment of the present invention, it is possible to provide a semiconductor device or the like having a novel structure that achieves reduction in power consumption. According to another embodiment of the present invention, it is possible to provide a semiconductor device or the like having a novel structure that can achieve fine-grained power gating.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the above effects and the other effects. Accordingly, one embodiment of the present invention does not have the above effects in some cases.

BRIEF DESCRIPTION OF THE DRAWINGS

In the accompanying drawings:

FIG. 8A and FIGS. 8B1 to 8B4 are a schematic diagram and layout diagrams which illustrate one embodiment of the present invention;

FIG. 9 is a cross-sectional view illustrating one embodiment of the present invention;

DETAILED DESCRIPTION OF THE INVENTION

Figure 1:
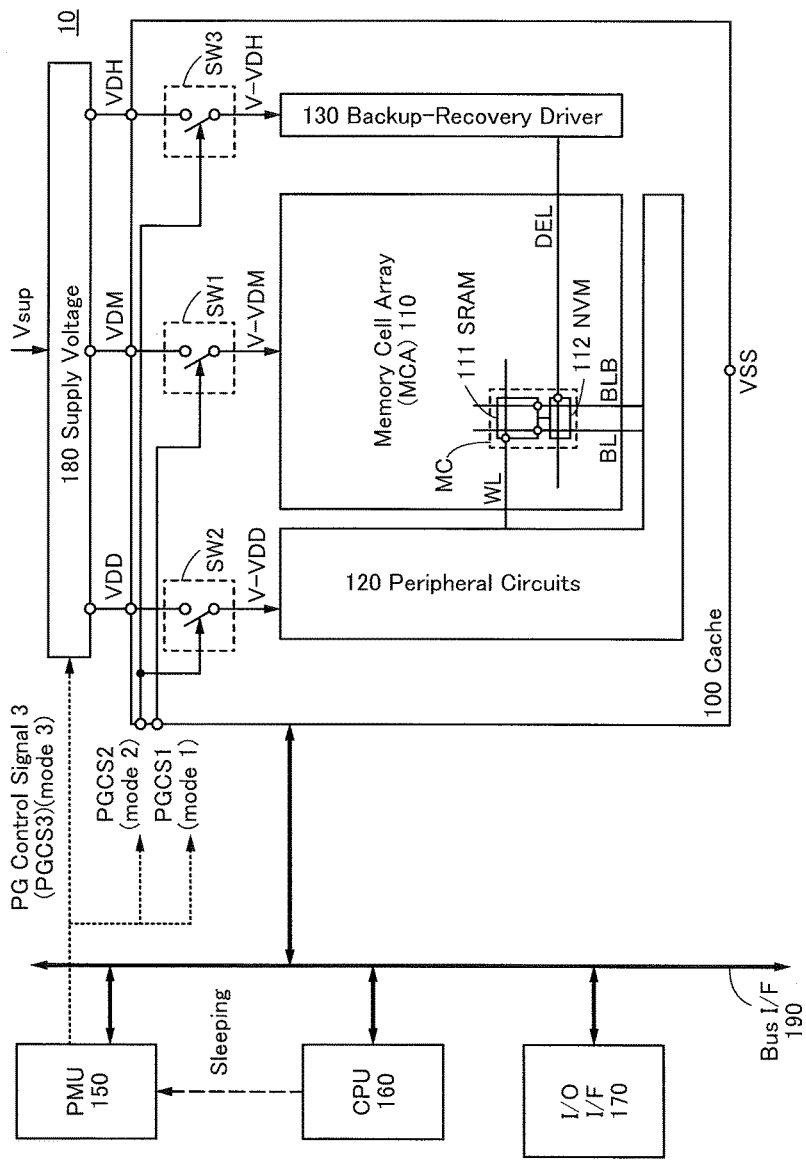
FIG. 1 is a block diagram illustrating one embodiment of the present invention.

Hereinafter, embodiments will be described with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In the drawings, the size, the layer thickness, or the region is exaggerated for clarity in some cases. Therefore, embodiments of the invention are not limited to such scales. Note that the drawings are schematic views showing ideal examples, and embodiments of the present invention are not limited to the shapes or the values in the drawings. For example, variation in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In this specification, ordinal numbers such as "first", "second", and "third" are used to avoid confusion among components, and thus do not limit the number of the components.

Note that in this specification, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.
(Embodiment 1)

In this embodiment, a block diagram of a semiconductor device and operations of a variety of circuits in power gating (hereinafter, abbreviated to PG) are described.

In this specification and the like, a semiconductor device means all devices that can function by utilizing semiconductor characteristics. The term "semiconductor device" refers to a memory such as a cache formed using semiconductor elements, e.g., transistors, peripheral circuits for controlling the memory, a CPU which inputs/outputs a signal to/from the memory and the peripheral circuits, a power supply voltage supplying circuit, a power management unit, and the entire system including the circuits.

<Block Diagram of Semiconductor Device>

FIG. 1 is a block diagram illustrating an example of a configuration of a semiconductor device.

A semiconductor device 10 includes a cache 100 (denoted by Cache), a power management unit (or power supply voltage control circuit) 150 (denoted by PMU), a CPU 160, an input/output interface 170 (denoted by I/O I/F), a power supply voltage supplying circuit 180 (or power supply voltage generation circuit) (denoted by Supply Voltage), and a bus interface 190 (denoted by Bus I/F).

The power management unit 150 has a function of switching three power gating states, i.e., first to third states.

A first state (denoted by mode 1) is a state where power gating is performed in a period longer than or equal to 50 ns and shorter than 500 μs. A second state (denoted by mode 2) is a state where power gating is performed in a period longer than or equal to 500 μs and shorter than 1 s. A third state (denoted by mode 3) is a state where power gating is performed in a period longer than or equal to 1 s.

The power management unit 150 supplies first to third power gating control signals (PG Control Signals: PGCS1 to PGCS3) to the cache 100 or the power supply voltage supplying circuit 180 to switch the first to third states.

The power management unit 150 can switch the first to third states in accordance with a sleeping signal (denoted by Sleeping) from the CPU 160, a signal from external hardware through the input/output interface 170, or a state of the bus interface 190.

The power management unit 150 may be simply referred to as a circuit.

The power management unit 150 can perform power gating by switching the first to third states with the first to third power gating control signals. Therefore, circuits included in the cache 100 can be subdivided, and thus power gating can be controlled for each circuit in accordance with situations. Consequently, fine-grained power gating can be performed, so that reduction in power consumption of the semiconductor device can be achieved.

The cache 100 includes a memory cell array 110 (Memory Cell Array: denoted by MCA), peripheral circuits (or drive control circuit) 120 (denoted by Peripheral Circuits), a backup/recovery driver (or data control circuit) 130 (denoted by Backup & Recovery Driver), and power switches SW1 to SW3.

The cache 100 is a device having a function of temporarily storing an instruction used in the CPU 160 or data such as arithmetic results, and is also referred to as a memory device.

Components included in the cache 100 will be described.

The memory cell array 110 includes a plurality of memory cells MC. The memory cell MC is a circuit based on an SRAM, and includes an SRAM 111 and a nonvolatile memory portion 112 (denoted by NVM).

Data writing/reading of the SRAM 111 are controlled by word lines WL, bit lines BL, and inverted bit lines BLB. The SRAM 111 can perform data writing/reading at high speed like a general SRAM. Data in the SRAM 111 is lost when a power supply voltage is not supplied.

Backup and recovery of data by the nonvolatile memory portion 112 are controlled by data control lines DEL. The nonvolatile memory portion 112 is a circuit having a function of backing up (also referred to as saving) data stored in the SRAM 111. Furthermore, the nonvolatile memory portion 112 is a circuit having a function of recovering (also referred to as restoring) data backed up. The nonvolatile memory portion 112 includes a nonvolatile memory circuit or a nonvolatile memory element.

The memory cell MC of one embodiment of the present invention which includes the SRAM 111 and the nonvolatile memory portion 112 can store data even when a power supply voltage is not supplied, only by backing up data stored in the SRAM 111 to the nonvolatile memory portion 112. The data stored in the nonvolatile memory portion 112 can be restored to the previous state only by recovering the data to the SRAM 111.

The memory cell array 110 including the memory cells MC can restore data to the previous state only by backing up data from the SRAM 111 to the nonvolatile memory portion 112 and then recovering the data. In that case, transition to a state where power gating can be performed and transition from the power gating state to the previous state can be performed in a short period. Therefore, in the case where there is no access to the cache 100 for a certain period, e.g., a period of several tens of nanoseconds, power gating can be performed in the memory cell array 110.

The peripheral circuits 120 are connected to the word lines WL, the bit lines BL, and the inverted bit lines BLB. The peripheral circuits 120 have a function of supplying a signal for writing data to the SRAM 111 and a signal for reading data from the SRAM 111. The peripheral circuits 120 are circuits including, for example, a decoder and a precharge circuit.

The backup/recovery driver 130 is connected to the data control lines DEL. The backup/recovery driver 130 has a function of supplying a signal for data backup and recovery between the SRAM 111 and the nonvolatile memory portion 112. The backup/recovery driver 130 is a circuit including, for example, a buffer and a level shifter.

Power gating of the peripheral circuits 120 and the backup/recovery driver 130 according to one embodiment of the present invention takes longer time than power gating of the memory cell array 110. Power gating of the peripheral circuits 120 and the backup/recovery driver 130 is not performed frequently, and is performed less frequently than power gating of the memory cell array 110. In this embodiment, power gating of the peripheral circuits 120 and the backup/recovery driver 130 is performed after power gating of the memory cell array 110 is performed.

In the case where power gating of the peripheral circuits 120 and the backup/recovery driver 130 is often performed, normal operation is adversely affected, so that power consumption is increased. Therefore, power gating of the peripheral circuits 120 and the backup/recovery driver 130 is preferably performed in the case where the memory cell array 110 is not accessed for a certain period (e.g., a period of several milliseconds) after power gating of the memory cell array 110.

The cache 100 is supplied with power supply voltages externally. The power supply voltages are supplied as, for example, the following three voltages: VDD/VSS, VDM/VSS, and VDH/VSS.

VDD/VSS is a power supply voltage supplied to the peripheral circuits 120. Supply of VDD/VSS to the peripheral circuits 120 is controlled by the power switch SW2. The power switch SW2 can switch whether VDD is supplied to a power supply potential line V-VDD connected to the peripheral circuits 120.

VDM/VSS is a power supply voltage supplied to the memory cell array 110. Supply of VDM/VSS to the memory cell array 110 is controlled by the power switch SW1. The power switch SW1 can switch whether VDM is supplied to a power supply potential line V-VDM connected to the memory cell array 110.

VDH/VSS is a power supply voltage supplied to the backup/recovery driver 130. Supply of VDH/VSS to the backup/recovery driver 130 is controlled by the power switch SW3. The power switch SW3 can switch whether VDH is supplied to a power supply potential line V-VDH connected to the backup/recovery driver 130.

On/off of the power switch SW1 is controlled by the first power gating control signal. On/off of the power switches SW2 and SW3 is controlled by the second power gating control signal. The first and second power gating control signals supplied to the power switches SW1 to SW3 are supplied from the power management unit 150.

Note that the power switches SW1 to SW3 can be formed using p-channel transistors, for example.

The above is the description of the components included in the cache 100.

In the semiconductor device of one embodiment of the present invention, the power gating state is changed depending on the non-access period to the cache 100. Specifically, with the first and second power gating control signals, supply of the power supply voltages to the circuits in the cache 100 is controlled to be stopped step-by-step.

First, in the case where there is no access to the cache 100 for a period of several nanoseconds, the power management unit 150 determines that the first state arises and outputs the first power gating control signal, and supply of the power supply voltage to the memory cell array 110 is stopped so that power gating is performed.

The SRAM 111 included in the memory cell array 110 consumes a large amount of power in idling. Therefore, the break-even time (BET) of power gating of the memory cell array 110 is short. Thus, power gating for a period of several nanoseconds allows the reduction of power consumption.

In the case where there is no access to the cache 100 for a period of several milliseconds, the power management unit 150 determines that the second state arises and outputs the second power gating control signal, and supply of the power supply voltages to the peripheral circuits 120 and the backup/recovery driver 130 is stopped so that power gating is performed.

The BET in the case where power gating is performed in the peripheral circuits 120 and the backup/recovery driver 130 in addition to the memory cell array 110 is longer than the BET in the case where power gating is performed only in the memory cell array 110. The semiconductor device can switch power gating in the first state where the BET is short and power gating in the second state where the BET is long depending on the non-access period to the cache 100.

According to one embodiment of the present invention, reduction in power consumption can be achieved. According to one embodiment of the present invention, fine-grained power gating can be achieved.

After power gating of the memory cell array 110, the peripheral circuits 120, and the backup/recovery driver 130 is performed in the second state, the power supply voltage supplying circuit 180 which supplies the power supply voltages to the cache 100 does not need to operate. Therefore, power gating of the power supply voltage supplying circuit 180 can be performed.

Power gating of the power supply voltage supplying circuit 180 is performed in such a manner that in the case where there is no access to the cache 100 for a period of several seconds, the power management unit 150 determines that the third state arises and outputs the third power gating control signal.

Note that power gating of the power supply voltage supplying circuit 180 can be performed by stopping generation of the power supply voltages VDD, VDM, and VDH, which is carried out by stopping the supply of a reference voltage Vsup to the power supply voltage supplying circuit 180.

The BET of the power gating of the power supply voltage supplying circuit 180 in addition to the memory cell array 110, the peripheral circuits 120, and the backup/recovery driver 130 is still longer than the BET of the memory cell array 110, the peripheral circuits 120, and the backup/recovery driver 130. The semiconductor device 10 can switch power gating in the first state where the BET is short, power gating in the second state where the BET is longer, and power gating in the third state where the BET is still longer depending on the non-access period to the cache 100.

According to one embodiment of the present invention, further reduction in power consumption can be achieved. According to one embodiment of the present invention, more improved fine-grained power gating can be achieved.

In the above-described semiconductor device of one embodiment of the present invention, the power gating state is changed depending on the non-access period to the cache 100. Specifically, with the first to third power gating control signals, supply of the power supply voltages to the circuits in the cache 100 and generation of the power supply voltages in the power supply voltage supplying circuit 180 are controlled to be stopped step-by-step.

According to one embodiment of the present invention, reduction in power consumption can be achieved. According to one embodiment of the present invention, fine-grained power gating can be achieved.

<Transition Between States in Power Gating>

Next, transition from the first state to the third state with the first to third power gating control signals is described with reference to FIG. 2. In FIGS. 3A to 3C, FIGS. 4A to 4C, and FIGS. 5A to 5C, the state of the cache 100 in the first to third states and a sequence of the first to third power gating control signals in backup and recovery are described.

Figure 2:
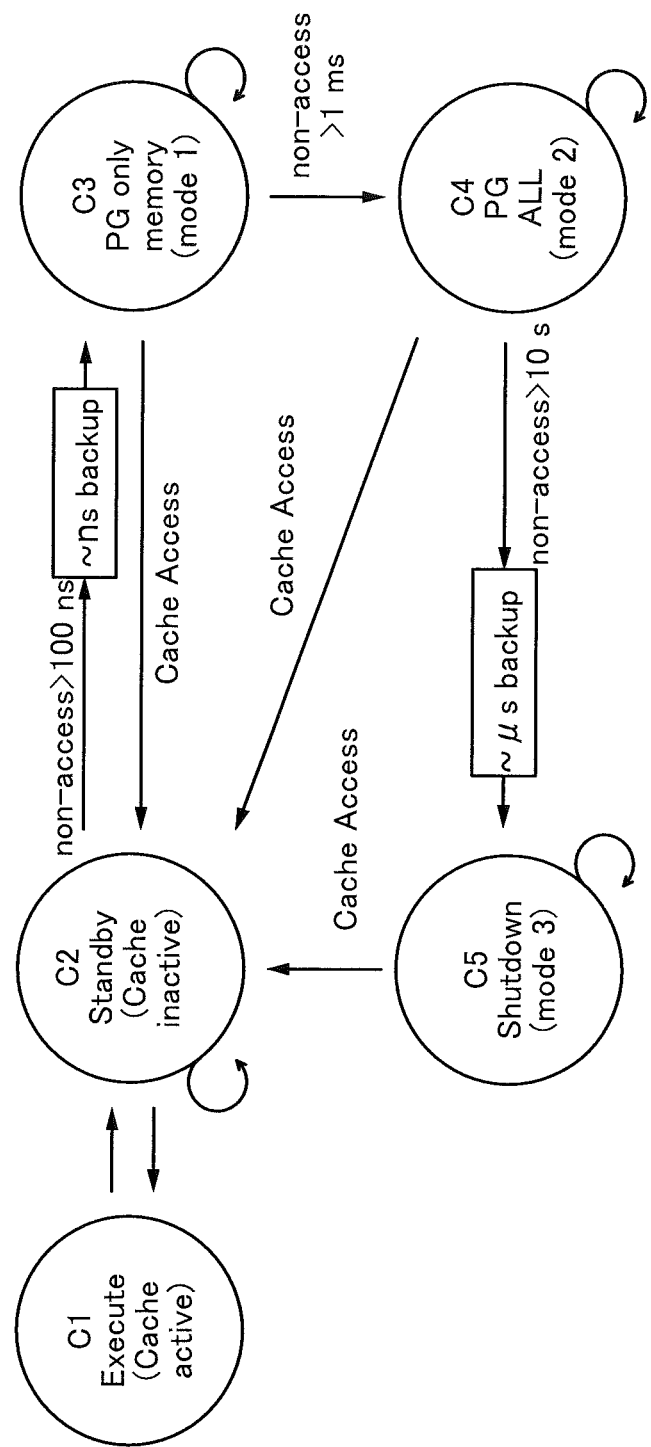
FIG. 2 is a state transition diagram illustrating one embodiment of the present invention.

In FIG. 2, possible states of the cache 100 are as follows: a normal operation state (denoted by Execute), which is referred to as C1; a standby state (denoted by Standby), which is referred to as C2; the first state where power gating is performed only in the memory cell array, which is referred to as C3; the second state where power gating is performed in the cache including the memory cell array and the peripheral circuits, which is referred to as C4; and the third state where power gating is performed in the power supply voltage supplying circuit 180, which is referred to as C5.

The normal operation C1 is a state where data writing/reading is performed in the cache 100.

The standby state C2 is a state where data writing/reading is not performed in the cache 100.

In the case where there is access from the CPU 160 to the cache 100 regularly, the normal operation C1 and the standby state C2 are repeated.

In the case where the standby state C2 is continued and there is no access to the cache 100 over 100 ns, for example, transition to the first state C3 is performed. In transition from the standby state C2 to the first state C3, backup of data from the SRAM 111 included in the memory cell MC to the nonvolatile memory portion 112 is performed preferably in a short period of several nanoseconds. In the case where backup of data is performed in a short period of several nanoseconds, data retention period becomes short in some cases; however, there is no problem because the interval until the next access is also short. With the structure, power gating can be efficiently performed.

In the case where there is access to the cache 100 in the first state C3, transition to the standby state C2 is performed. In transition from the first state C3 to the standby state C2, the data is recovered from the nonvolatile memory portion 112 included in the memory cell MC to the SRAM 111.

Figure 3A:
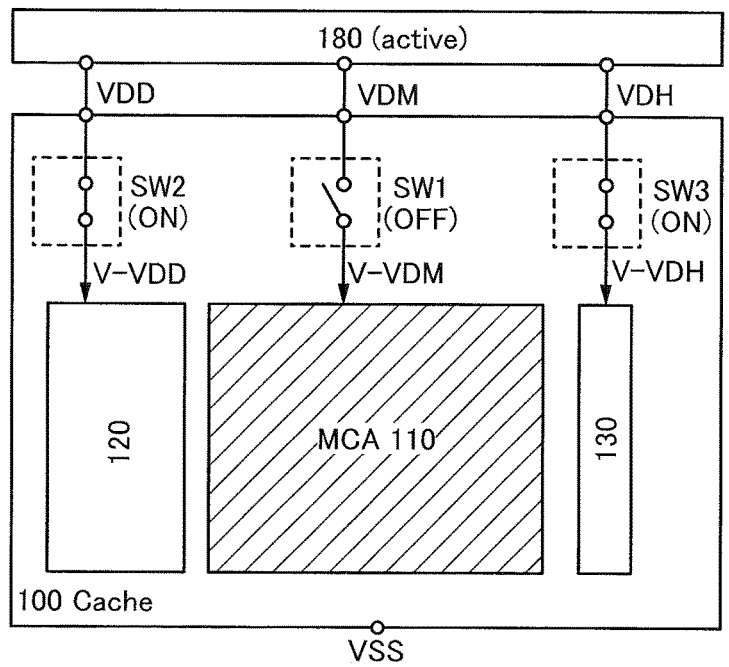
FIGS. 3A to 3C are a block diagram and timing charts which illustrate one embodiment of the present invention.

As shown in FIG. 3A, in the first state C3, power supply voltages are generated in the power supply voltage supplying circuit 180, the power switch SW1 is turned off, and the power switches SW2 and SW3 are turned on; thus, power gating is performed in the memory cell array 110. The hatched component in FIG. 3A represents a component where power gating is performed.

Figure 3B:
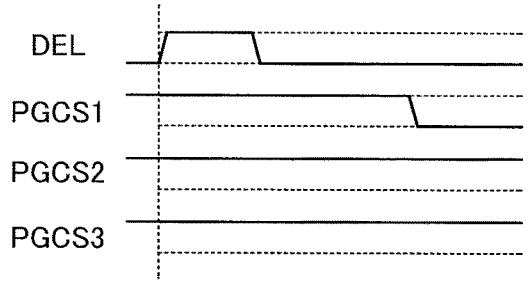

Backup of data from the standby state C2 to the first state C3 is performed by controlling the first to third power gating control signals and the potential of the data control line DEL according to a timing chart in FIG. 3B. When the potential of the data control line DEL is at H level, backup is performed, and when the potential of the data control line DEL is at L level, data holding is performed. When the first to third power gating control signals are at H level, the power switches are turned on, and when the first to third power gating control signals are at L level, the power switches are turned off.

According to the timing chart in FIG. 3B, the potential of the data control line DEL is set to H level first, and data is backed up from the SRAM 111 to the nonvolatile memory portion 112. Then, the first power gating control signal is changed from H level to L level; thus, power gating is performed in the memory cell array 110.

Figure 3C:
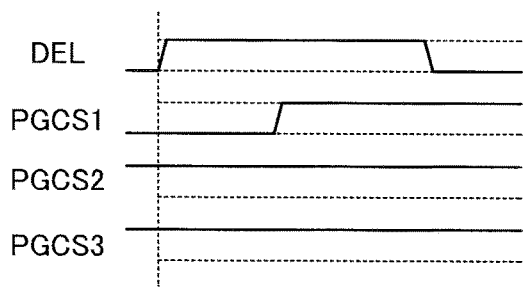

Recovery of data from the first state C3 to the standby state C2 is performed by controlling the first to third power gating control signals and the potential of the data control line DEL according to a timing chart in FIG. 3C.

According to the timing chart in FIG. 3C, the potential of the data control line DEL is set to H level first, and data is recovered from the SRAM 111 to the nonvolatile memory portion 112. Next, in the state where the potential of the data control line DEL is at H level, the first power gating control signal is changed from L level to H level, and the memory cell array 110 is returned from the power gating state to a state where the power supply voltage is supplied.

In the case where the first state C3 is continued and there is no access to the cache 100 over 1 ms, for example, transition to the second state C4 is performed.

In transition from the first state C3 to the second state C4, backup of data from the SRAM 111 included in the memory cell MC to the nonvolatile memory portion 112 may be performed by holding data backed up in the first state C3 without any change. Alternatively, data backed up in the first state C3 may be recovered once, and then backup may be performed again. With the structure, data can be reliably held.

In the case where there is access to the cache 100 in the second state C4, transition to the standby state C2 is performed. In transition from the second state C4 to the standby state C2, the data is recovered from the nonvolatile memory portion 112 included in the memory cell MC to the SRAM 111.

Figure 4A:
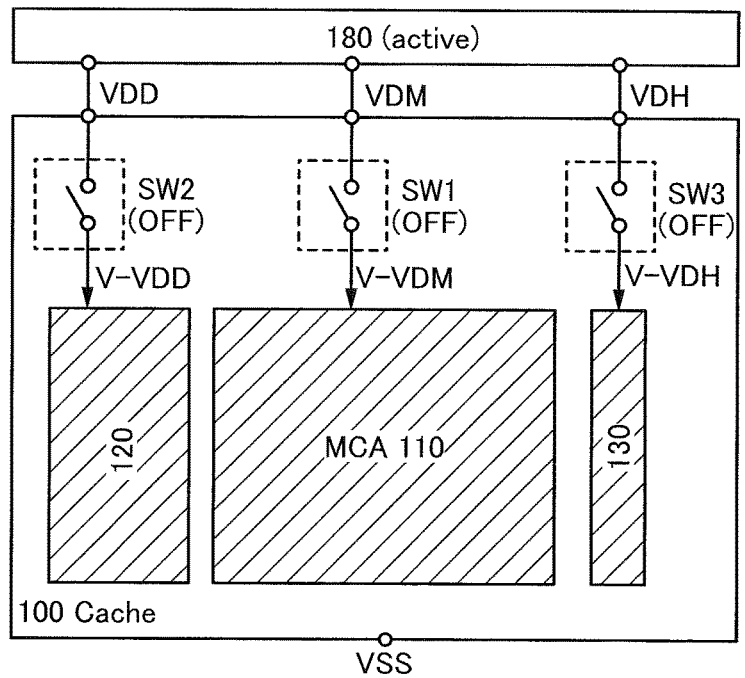
FIGS. 4A to 4C are a block diagram and timing charts which illustrate one embodiment of the present invention.

As shown in FIG. 4A, in the second state C4, power supply voltages are generated in the power supply voltage supplying circuit 180, and the power switches SW1 to SW3 are turned off; thus, power gating is performed in the memory cell array 110, the peripheral circuits 120, and the backup/recovery driver 130. The hatched components in FIG. 4A represent components where power gating is performed.

Figure 4B:
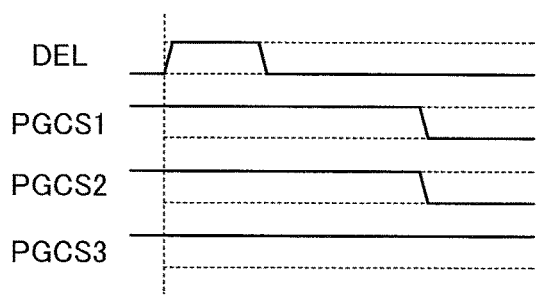

In the case where backup of data from the first state C3 to the second state C4 is performed again, the backup is performed by controlling the first to third power gating control signals and the potential of the data control line DEL according to a timing chart in FIG. 4B.

According to the timing chart in FIG. 4B, the potential of the data control line DEL is set to H level first, and data is backed up from the SRAM 111 to the nonvolatile memory portion 112. Then, the first and second power gating control signals are changed from H level to L level; thus, power gating is performed in the memory cell array 110, the peripheral circuits 120, and the backup/recovery driver 130.

Figure 4C:
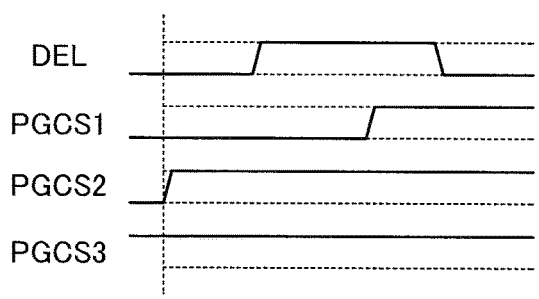

Recovery of data from the second state C4 to the standby state C2 is performed by controlling the first to third power gating control signals and the potential of the data control line DEL according to a timing chart in FIG. 4C.

According to the timing chart in FIG. 4C, the second power gating control signal is changed from L level to H level first, and the peripheral circuits 120 and the backup/recovery driver 130 are returned from the power gating state to a state where the power supply voltages are supplied. Next, the potential of the data control line DEL is set to H level, and data is recovered from the SRAM 111 to the nonvolatile memory portion 112. Then, in the state where the potential of the data control line DEL is at H level, the first power gating control signal is changed from L level to H level, and the memory cell array 110 is returned from the power gating state to the state where the power supply voltage is supplied.

In the case where the second state C4 is continued and there is no access to the cache 100 over 10 s, for example, transition to the third state C5 is performed.

In transition from the second state C4 to the third state C5, backup of data from the SRAM 111 included in the memory cell MC to the nonvolatile memory portion 112 may be performed by holding data backed up in the first state C2 or the second state C4 without any change. Alternatively, data backed up in the first state C3 or the second state C4 may be recovered once, and then backup may be performed again. With the structure, data can be reliably held.

In the case where there is access to the cache 100 in the third state C5, transition to the standby state C2 is performed. In transition from the third state C5 to the standby state C2, the data is recovered from the nonvolatile memory portion 112 included in the memory cell MC to the SRAM 111.

Figure 5A:
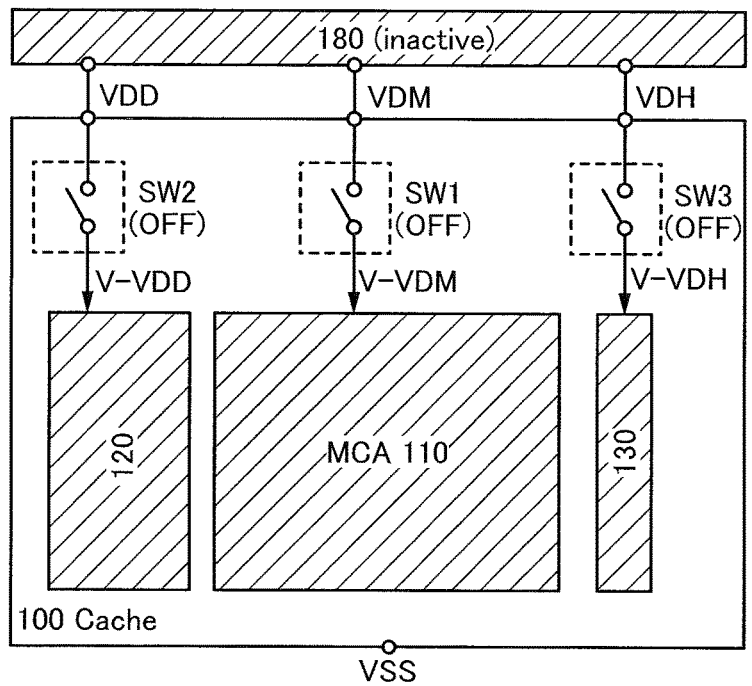
FIGS. 5A to 5C are a block diagram and timing charts which illustrate one embodiment of the present invention.

As shown in FIG. 5A, in the third state C5, the power switches SW1 to SW3 are turned off; thus, power gating of the memory cell array 110, the peripheral circuits 120, and the backup/recovery driver 130 and power gating in which generation of power supply voltages in the power supply voltage supplying circuit 180 is stopped are performed. The hatched components in FIG. 5A represent components where power gating is performed.

Figure 5B:
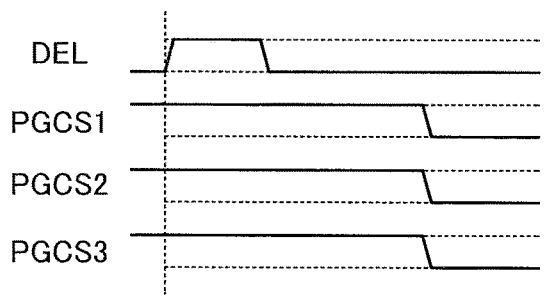

In the case where backup of data from the first state C3 or the second state C4 to the third state C5 is performed again, the backup is performed by controlling the first to third power gating control signals and the potential of the data control line DEL according to a timing chart in FIG. 5B.

In the timing chart in FIG. 5B, the potential of the data control line DEL is set to H level first, and data is backed up from the SRAM 111 to the nonvolatile memory portion 112. Then, the first to third power gating control signals are changed from H level to L level; thus, power gating is performed in the power supply voltage supplying circuit 180, the memory cell array 110, the peripheral circuits 120, and the backup/recovery driver 130.

Figure 5C:
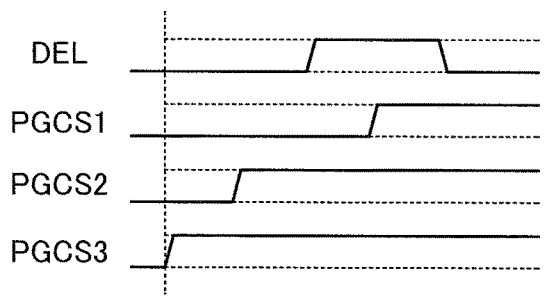

Recovery of data from the third state C5 to the standby state C2 is performed by controlling the potentials of the first to third power gating control signals and the data control line DEL according to a timing chart in FIG. 5C.

According to the timing chart in FIG. 5C, the third power gating control signal is changed from L level to H level first, and the power supply voltage supplying circuit 180 is returned from the power gating state to a state where the power supply voltages are generated. Next, the second power gating control signal is set from L level to H level, and the peripheral circuits 120 and the backup/recovery driver 130 are returned from the power gating state to the state where the power supply voltages are supplied. Next, the potential of the data control line DEL is set to H level, and data is recovered from the SRAM 111 to the nonvolatile memory portion 112. Then, in the state where the potential of the data control line DEL is at H level, the first power gating control signal is changed from L level to H level, and the memory cell array 110 is returned from the power gating state to the state where the power supply voltage is supplied.

In the above-described semiconductor device of one embodiment of the present invention, the power gating state is changed depending on the non-access period to the cache 100. Specifically, with the first to third power gating control signals, supply of the power supply voltages to the circuits in the cache 100 and generation of the power supply voltages in the power supply voltage supplying circuit 180 are controlled to be stopped step-by-step.

According to one embodiment of the present invention, reduction in power consumption can be achieved. According to one embodiment of the present invention, fine-grained power gating can be achieved.

This embodiment can be combined with any of the other embodiments as appropriate.

(Embodiment 2)

In this embodiment, a specific configuration of the block diagram in FIG. 1 is described. In this embodiment, a specific example of a memory cell and an OS transistor are described.

<Specific Example of Block Diagram of Semiconductor Device>

Figure 6:
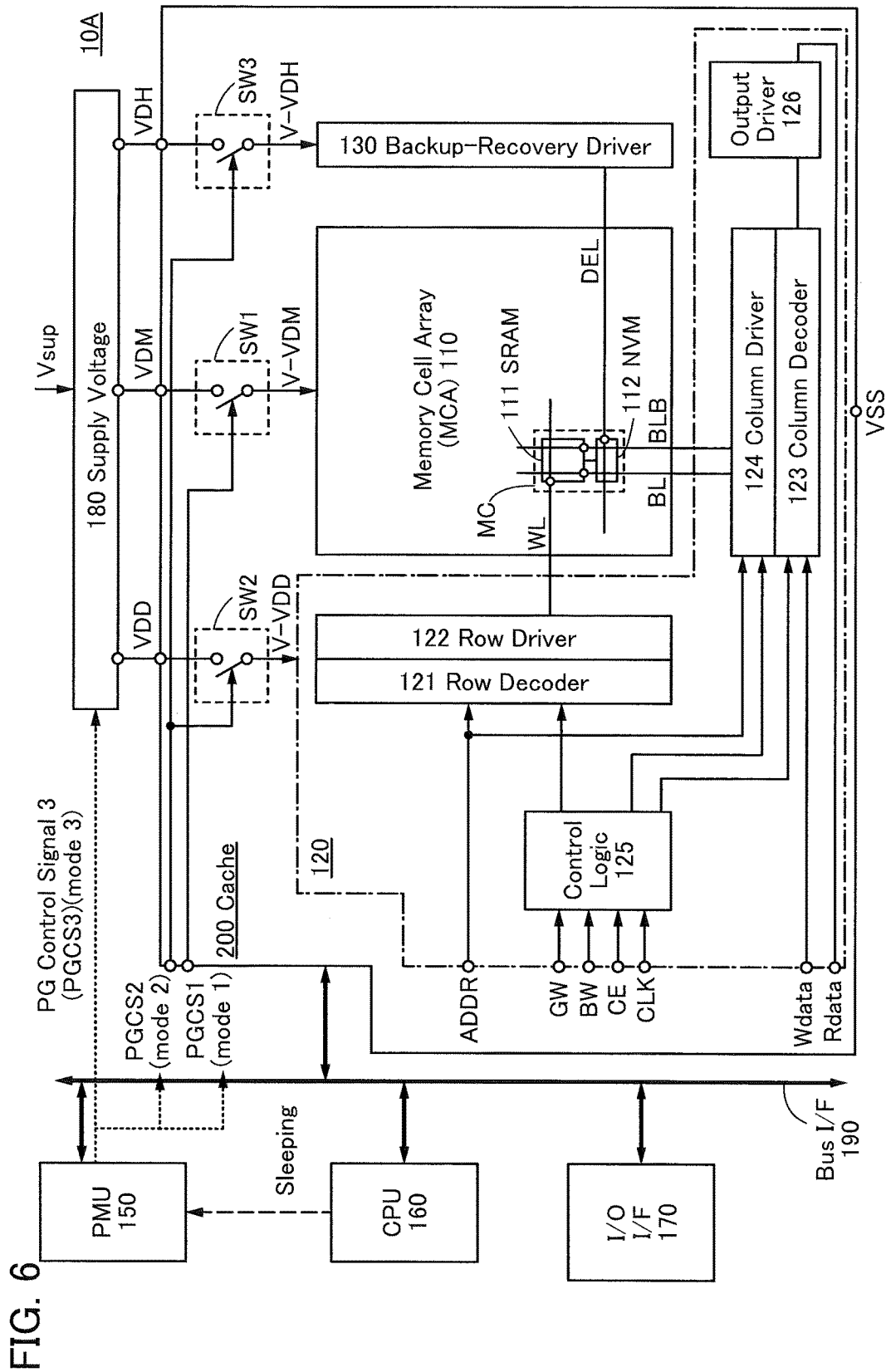
FIG. 6 is a block diagram illustrating one embodiment of the present invention.

FIG. 6 is a block diagram illustrating a specific example of the configuration of the semiconductor device 10 in FIG. 1. Note that in this embodiment, description which overlaps with the description in Embodiment 1 is omitted and the above description is referred to.

A semiconductor device 10A includes a cache 200, the power management unit 150, the CPU 160, the input/output interface 170, the power supply voltage supplying circuit 180, and the bus interface 190.

The cache 200 includes the memory cell array 110, the peripheral circuits 120, the backup/recovery driver 130, and the power switches SW1 to SW3.

The peripheral circuits 120 include a row decoder 121, a row driver 122, a column decoder 123, a column driver 124, a driver control logic circuit 125, and an output driver 126.

An address signal ADDR and a control signal from the driver control logic circuit 125 are supplied to the row decoder 121 and the row driver 122. The row decoder 121 and the row driver 122 are a circuit having a function of generating a signal supplied to the word line WL, for example, a word signal. By control of the power switch SW2, power gating of the row decoder 121 and the row driver 122 is performed, i.e., restart and stop of the function are controlled. When the function is stopped, the row driver 122 is preferably held in a state where the word line WL is kept at a low power supply potential.

An address signal ADDR and a control signal from the driver control logic circuit 125 are supplied to the column decoder 123 and the column driver 124. The column decoder 123 and the column driver 124 are a circuit having a function of generating a signal supplied to the bit line BL and the inverted bit line BLB, e.g., a precharge signal and a function of supplying written data Wdata to be input to the bit line BL and the inverted bit line BLB. The column decoder 123 and the column driver 124 include a sense amplifier and are a circuit having a function of outputting a signal read from the memory cell array 110 to the output driver 126. By control of the power switch SW2, power gating of the column decoder 123 and the column driver 124 is performed, i.e., restart and stop of the functions are controlled. When the functions are stopped, the column driver 124 is preferably held in a state where the bit line BL and the inverted bit line BLB are kept at low power supply potentials or in an electrically floating state.

The driver control logic circuit 125 is a circuit having a function of generating signals for controlling the row decoder 121, the row driver 122, the column decoder 123, and the column driver 124 in accordance with a global write signal (GW), a byte write signal (BW), a chip enable signal (CE), and a clock signal (CLK) which are input. By control of the power switch SW2, power gating of the driver control logic circuit 125 is performed and restart and stop of the function is controlled.

The output driver 126 is a circuit having a function of generating read data Rdata on the basis of data obtained by the column decoder 123 and the column driver 124 and outputting the read data Rdata to an external device.

After power gating of the memory cell array 110 is performed, the functions of the circuits included in the peripheral circuits 120 are stopped after the operation is stopped. The stop of the functions is performed by controlling the second power gating control signal so that the power switch SW2 is off. The restart of the functions is performed by turning on the power switch SW2, and the timing of turning on the power switch SW2 is earlier than the timing of turning on the power switch SW1.

<Specific Example of Memory Cell>

Next, a specific example of the memory cell in FIG. 1 is described.

Figure 7A:
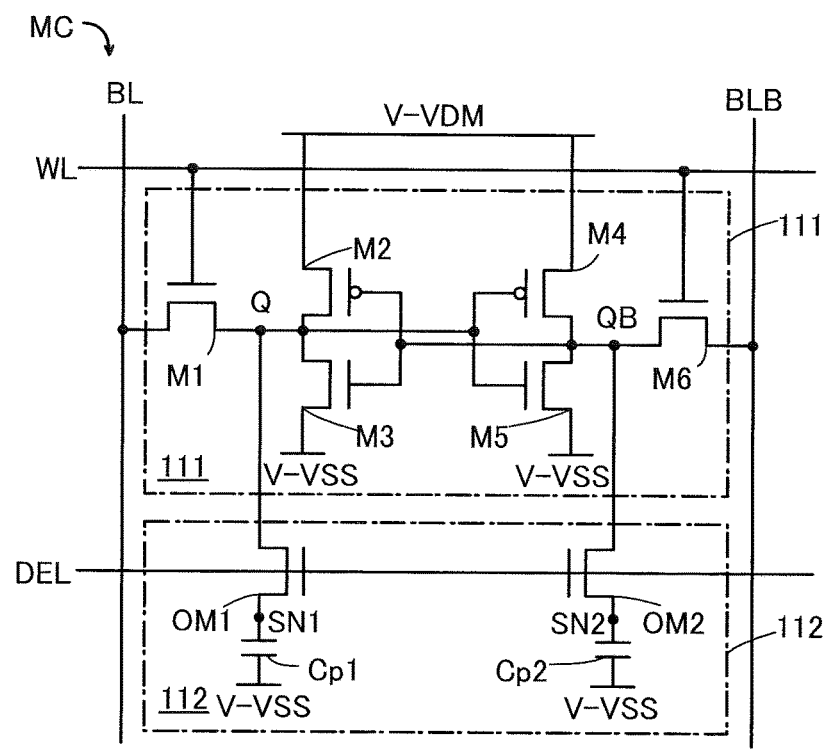
FIGS. 7A and 7B are a circuit diagram and a timing chart which illustrate one embodiment of the present invention.

A memory cell MC illustrated in FIG. 7A includes the SRAM 111 and the nonvolatile memory portion 112. The SRAM 111 includes transistors M1 to M6. The nonvolatile memory portion 112 includes transistors OM1 and OM2 and capacitors Cp1 and Cp2.

In FIG. 7A, a node between the transistor M1 and the transistor OM1 is referred to as a node Q. A node between the transistor M6 and the transistor OM2 is referred to as a node QB. A node between the transistor OM1 and the capacitor Cp1 is referred to as a node SN1. A node between the transistor OM2 and the capacitor Cp2 is referred to as a node SN2.

In FIG. 7A, a word line WL, a bit line BL, an inverted bit line BLB, a data control line DEL, a power supply potential line V-VDM, and a power supply potential line V-VSS are shown.

The transistors M1 to M6 included in the SRAM 111 are transistors including a semiconductor such as silicon (Si transistors) in a channel region. The transistors OM1 and OM2 included in the nonvolatile memory portion 112 are transistors having lower off-state currents than Si transistors.

An example of a transistor having a lower off-state current than a Si transistor includes a transistor including an oxide semiconductor in a semiconductor layer (OS transistor). The off-state current of an OS transistor can be extremely low by reducing the concentration of impurities in an oxide semiconductor to make the oxide semiconductor intrinsic or substantially intrinsic.

In the memory cell MC in FIG. 7A, when the transistors OM1 and OM2 are turned on, the potentials of the nodes Q and QB can be supplied to the nodes SN1 and SN2, respectively. When the transistors OM1 and OM2 are turned off, charge corresponding to the potentials can be constantly held at the nodes SN1 and SN2 which are in an electrically floating state. Since the charge can be constantly held even after supply of the power supply voltage is stopped, the nonvolatile memory portion 112 included in the memory cell MC can be nonvolatile.

Note that in a period for retaining a potential, a predetermined voltage is continuously supplied to the transistors OM1 and OM2 in some cases. For example, a voltage that completely turns off the transistors OM1 and OM2 might keep being supplied to gates of the transistors OM1 and OM2. Alternatively, a voltage that shifts the threshold voltages to allow the transistors OM1 and OM2 exist in a normally-off state may keep being supplied to back gates of the transistors OM1 and OM2. In these cases, a voltage is supplied to the memory cell MC in the period for retaining data; however, little power is consumed because almost no current flows. Because of little power consumption, the memory cell MC can be regarded as being substantially nonvolatile even if a predetermined voltage is supplied to the memory cell MC.

The following explanation is provided for the cases where the OS transistor is an n-channel transistor unless otherwise specified. Therefore, in each of the transistors OM1 and OM2, when a signal supplied to a gate is at H level, a source and a drain are electrically conductive therebetween, and when a signal supplied to the gate is at L level, the source and the drain are not electrically conductive therebetween.

Figure 7B:
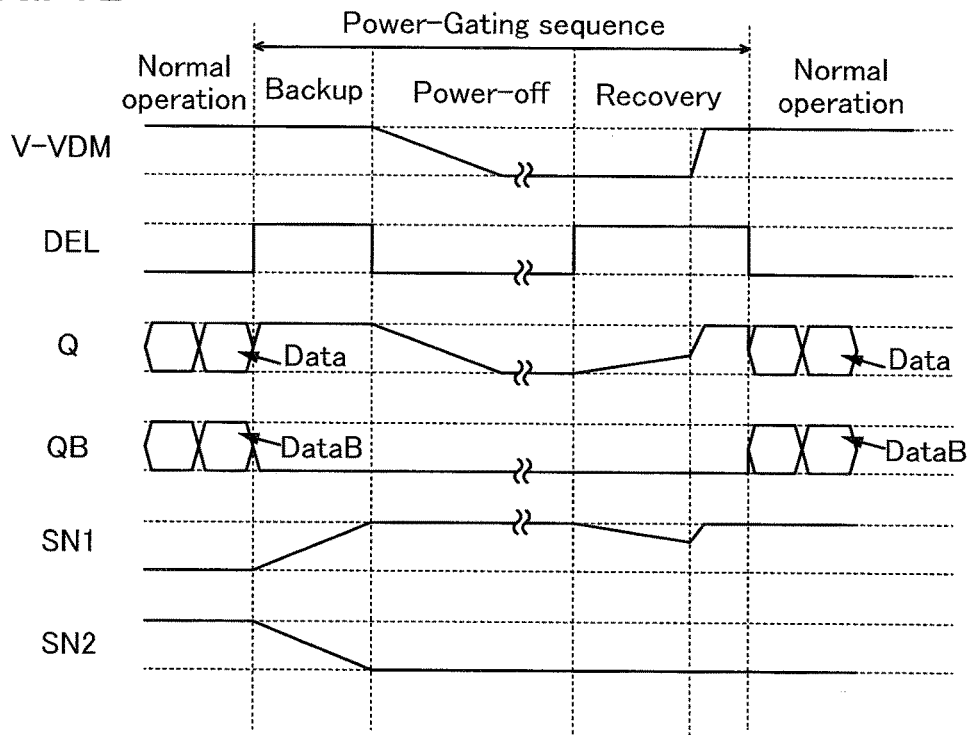

Next, operation shown in the circuit diagram in FIG. 7A is described using a timing chart in FIG. 7B. In FIG. 7B, a power-gating sequence (PG sequence) of backup (Backup), stop of supply of a power supply voltage (Power-off), and recovery (Recovery) is described.

According to the timing chart in FIG. 7B, data Data and data DataB are first held at the nodes Q and QB in normal operation (Normal operation), respectively. In FIG. 7B, a case is explained as an example that the data Data is at an H-level potential and the data DataB is at an L-level potential just before the Backup.

In backup, first, the data control line DEL is set to H level so that the transistors OM1 and OM2 are turned on. The nodes SN1 and SN2 are set to the same potential as the nodes Q and QB, respectively, so that backup to the nodes SN1 and SN2 is performed. In FIG. 7B, an H-level potential is held at the node SN1 and an L-level potential is held at the node SN2.

In the backup operation, the data control line DEL is set to H level for 3 ns to 10 ns, by which data can be held for several microseconds. Furthermore, when the data control line DEL is set to H level for 10 μs or longer, data can be held for 24 h (1 day) or longer.

After the backup operation is finished, supply of the power supply voltages is stopped. In other words, the potential of the power supply potential line V-VDM is set to a potential equal to the potential of the power supply potential line V-VSS, i.e., an L-level potential. As the potential of the power supply potential line V-VDM is decreased, the potential of the node Q is also decreased. In contrast, when the data control line DEL is set to L level, the potentials of the nodes SN1 and SN2 are held.

In recovery, first, the data control line DEL is set to H level so that the transistors OM1 and OM2 are turned on. Thus, the nodes Q and QB are set to the same potential as the nodes SN1 and SN2. Consequently, a potential difference between the node Q and the node QB is generated. In the state where the potential difference is generated, the potential of the power supply potential line V-VDM is set to H level. Then, the nodes Q and QB are returned to the potentials just before the Backup period.

Through the above PG sequence, normal operation can be restarted.

<OS Transistor>

The OS transistor used for the memory cell MC is a transistor having a lower off-state current than a Si transistor.

The off-state current of an OS transistor can be reduced by reducing the concentration of impurities in an oxide semiconductor to make the oxide semiconductor intrinsic or substantially intrinsic. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$. In the oxide semiconductor, hydrogen, nitrogen, carbon, silicon, and metal elements that are not main components are impurities. For example, hydrogen and nitrogen form donor levels to increase the carrier density.

A transistor using an intrinsic or substantially intrinsic oxide semiconductor has a low carrier density and thus is less likely to have negative threshold voltage. In addition, because of few carrier traps in the oxide semiconductor, the transistor including the oxide semiconductor has small variation in electrical characteristics and high reliability. Furthermore, the transistor including the oxide semiconductor enables to make the off-state current extremely low.

For example, the OS transistor with reduced off-state current can exhibit a normalized off-state current per micrometer of a channel width of $1 \times 10^{-18}$ A or less, $1 \times 10^{-21}$ A or less, or $1 \times 10^{-24}$ A or less at room temperature (approximately 25° C.), or $1 \times 10^{-15}$ A or less, $1 \times 10^{-18}$ A or less, or $1 \times 10^{-21}$ A or less at 85° C.

Note that the off-state current of an n-channel transistor refers to a current that flows between a source and a drain when the transistor is off. For example, the off-state current of an n-channel transistor with a threshold voltage of about 0 V to 2 V refers to a current that flows between a source and a drain when a negative voltage is applied between a gate and the source.

Thus, in the memory cell MC including an OS transistor, charge can be held at the nodes SN1 and SN2 even when the OS transistor is turned off and supply of the power supply voltage is stopped. By restarting the supply of the power supply voltage in accordance with the held charge, the memory cell MC can be returned to a state before the supply of the power supply voltage is stopped.

An OS transistor used as a component of the memory cell MC can have favorable switching characteristics in addition to low off-state current.

An OS transistor used for the memory cell MC is formed over an insulating surface. Therefore, unlike in a Si transistor using a semiconductor substrate as its channel formation region, parasitic capacitance is not formed between a gate electrode and the semiconductor substrate.

Consequently, with the use of the OS transistor, carriers can be controlled easily with a gate electric field, and favorable switching characteristics are obtained.

Note that the structures, methods, and the like described in this embodiment can be used as appropriate in combination with any of the structures, methods, and the like described in the other embodiments.

(Embodiment 3)

In this embodiment, an oxide semiconductor layer that can be used as a semiconductor layer of the transistor with low off-state current described in the above embodiment is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, or 2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be higher than that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

In this manner, the transistor including an i-type (intrinsic) or substantially i-type oxide semiconductor film can have extremely favorable off-state current characteristics. For example, the drain current per a channel width at the time when the transistor including an oxide semiconductor film is in an off-state at room temperature (approximately 25° C.) can be less than or equal to $1\times10\text{-}18$ A/μm, less than or equal to $1\times10\text{-}21$ A/μm, or less than or equal to $1\times10\text{-}24$ A/μm; or at 85° C., less than or equal to $1\times10\text{-}15$ A/μm, less than or equal to $1\times10\text{-}18$ A/μm, or less than or equal to $1\times10\text{-}21$ A/μm. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

A structure of the oxide semiconductor film is described below.

An oxide semiconductor film is classified roughly into a non-single-crystal oxide semiconductor film and a single-crystal oxide semiconductor film The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 11A:
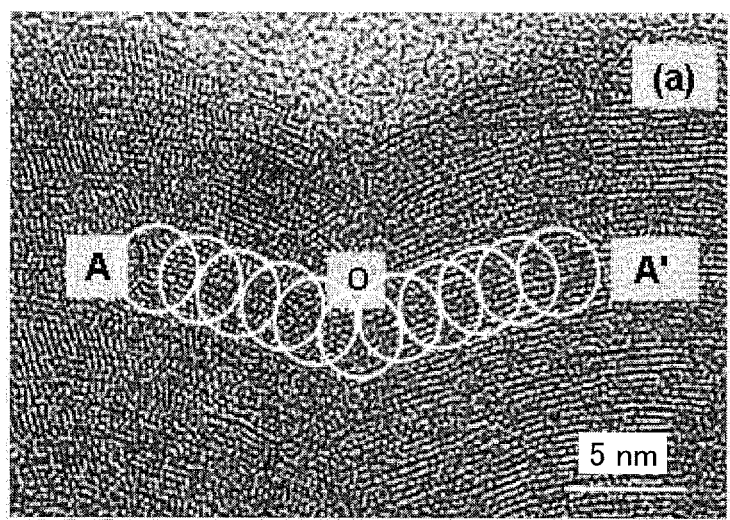
FIGS. 11A to 11C are high-resolution TEM images and local Fourier transform images of a cross section of an oxide semiconductor.
Figure 11B:
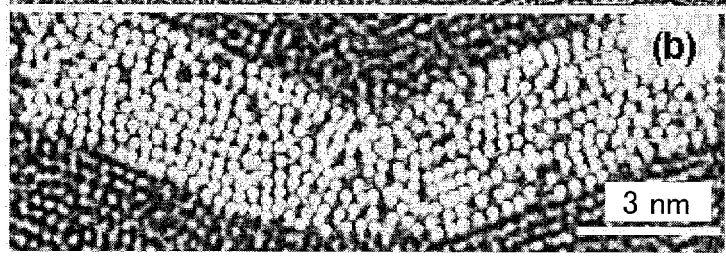

FIG. 11A is a high-resolution cross-sectional TEM image of a CAAC-OS film FIG. 11B is a high-resolution cross-sectional TEM image obtained by enlarging the image of FIG. 11A. In FIG. 11B, atomic arrangement is highlighted for easy understanding.

Figure 11C:
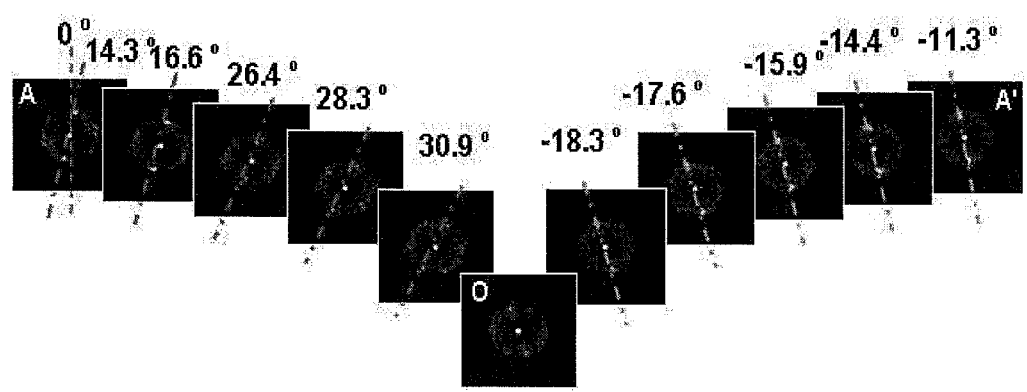

FIG. 11C is Fourier transform images of regions each surrounded by a circle (the diameter is approximately 4 nm) between A and O and between O and A' in FIG. 11A. C-axis alignment can be observed in each region in FIG. 11C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 12A).

From the results of the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm2 or more, 5 μm2 or more, or 1000 μm2 or more is observed in some cases in the high-resolution plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (Φ scan) is performed under conditions where the sample is rotated around a normal vector of a sample surface as an axis (Φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when Φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31 20 . The peak of 2θ at around 36° indicates that a crystal having no c-axis alignment is included in part of the CAAC-OS film It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charge trapped by the carrier traps in the oxide semiconductor film takes a long time to be released, and might behave like fixed charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus can have high electron mobility. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film tends to have larger variation in electrical characteristics and lower reliability than a transistor including a CAAC-OS film.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film In a high resolution TEM image of the nc-OS film, a grain boundary cannot be found clearly in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, circumferentially distributed spots can be observed. Also in a nanobeam electron diffraction pattern of the nc-OS film, a plurality of spots can be observed in the circumferentially distributed spots (see FIG. 12B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Thus, the nc-OS film may have a higher carrier density than the CAAC-OS film The oxide semiconductor film having a high carrier density may have high electron mobility. Thus, a transistor including the nc-OS film may have high field-effect mobility. The nc-OS film has a higher density of defect states than the CAAC-OS film, and thus may have a large number of carrier traps. Consequently, a transistor including the nc-OS film has larger variation in electrical characteristics and lower reliability than a transistor including the CAAC-OS film The nc-OS film can be formed easily as compared to the CAAC-OS film because the nc-OS film can be formed even when a relatively large amount of impurities are included; thus, depending on the purpose, the nc-OS film can be favorably used. Therefore, a memory device including the transistor using the nc-OS film can be manufactured with high productivity.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film Therefore, a transistor including the amorphous oxide semiconductor film tends to be normally on. Thus, in some cases, such an amorphous oxide semiconductor layer can be preferably applied to a transistor which needs to be normally on. As mentioned above, since the amorphous oxide semiconductor film has a high density of defect states, it has increased carrier traps. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased.

Accordingly, a transistor including the single-crystal oxide semiconductor film is unlikely to be normally on. Moreover, since the single-crystal oxide semiconductor film has a lower impurity concentration and a lower density of defect states, carrier traps are reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void can be observed. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is scarcely observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. The maximum length of the region in which the lattice fringes are observed is regarded as the size of the crystal parts of the amorphous-like OS film and the nc-OS film. Note that the crystal part whose size is 0.8 nm or larger is selectively evaluated.

Figure 13:
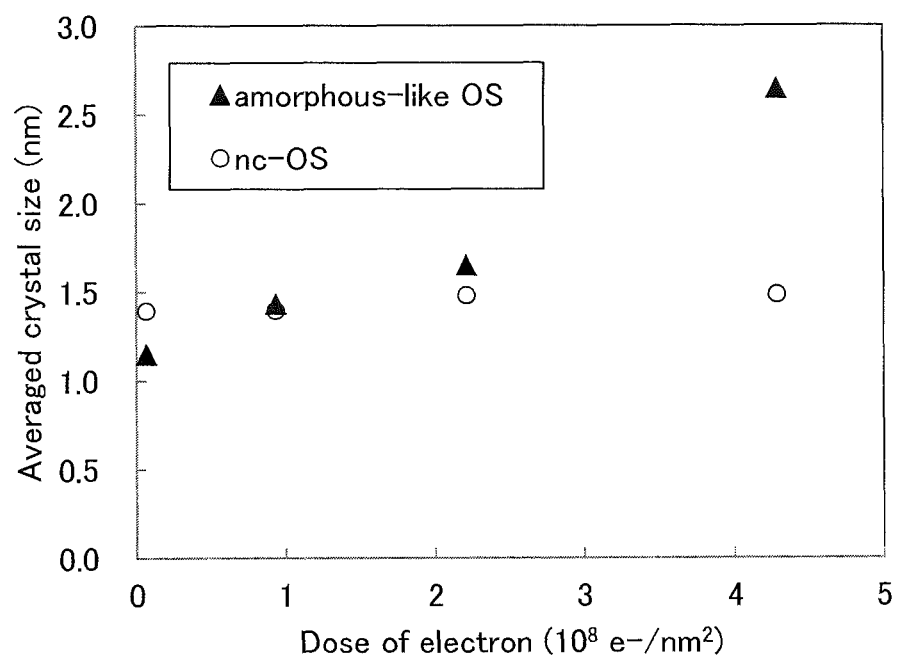
FIG. 13 shows a change in crystal parts by electron beam irradiation.

FIG. 13 shows examination results of change in average size of crystal parts (20-40 points) in the amorphous-like OS film and the nc-OS film using the high-resolution TEM images. FIG. 13 indicates that the crystal part size in the amorphous-like OS film increases with an increase in the cumulative electron dose. Specifically, the crystal part of approximately 1.2 nm at the start of TEM observation grows to a size of approximately 2.6 nm at a cumulative electron dose of $4.2 \times 10^8$ $e^-/nm^2$. In contrast, the crystal part size in the good-quality nc-OS film shows little change from the start of electron irradiation to a cumulative electron dose of 4.2×108 e−/nm2 regardless of the cumulative electron dose.

Furthermore, in FIG. 13, by linear approximation of the change in the crystal part size in the amorphous-like OS film and the nc-OS film and extrapolation to a cumulative electron dose of 0 $e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, one of the methods for structural analysis is the nanobeam electron diffraction.

Figure 12A:
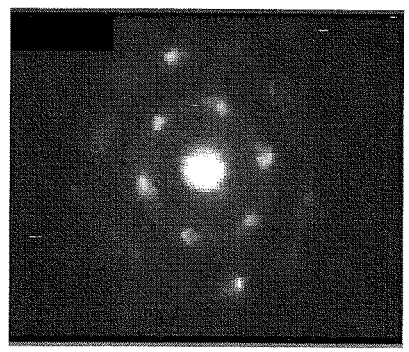
FIGS. 12A and 12B are nanobeam electron diffraction patterns of oxide semiconductor films.
Figure 12B:
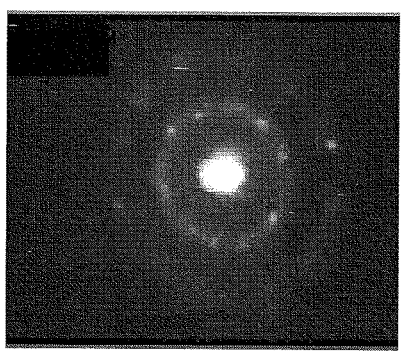
Figure 12C:
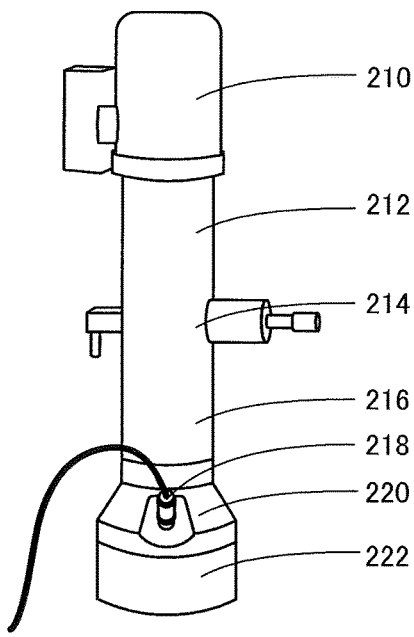
FIGS. 12C and 12D illustrate an example of a transmission electron diffraction measurement apparatus.

FIG. 12C illustrates a transmission electron diffraction measurement apparatus. The transmission electron diffraction measurement apparatus includes an electron gun chamber 210, an optical system 212 below the electron gun chamber 210, a sample chamber 214 below the optical system 212, an optical system 216 below the sample chamber 214, an observation chamber 220 below the optical system 216, a camera 218 provided for the observation chamber 220, and a film chamber 222 below the observation chamber 220. The camera 218 is provided to face toward the inside of the observation chamber 220. Note that the film chamber 222 is not necessarily provided.

Figure 12D:
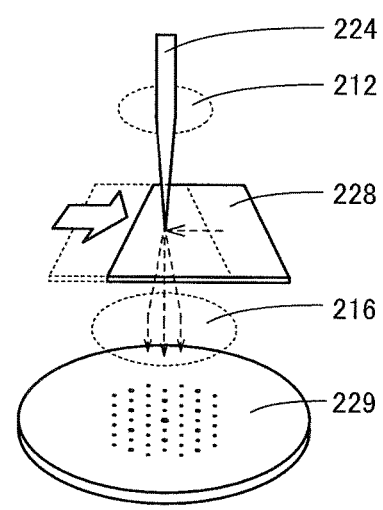

FIG. 12D illustrates the internal structure of the transmission electron diffraction measurement apparatus in FIG. 12C. In the transmission electron diffraction measurement apparatus, a substance 228 which is positioned in the sample chamber 214 is irradiated with electrons emitted from an electron gun installed in the electron gun chamber 210 through the optical system 212. The electrons which have passed through the substance 228 enter a fluorescent plate 229 which is installed in the observation chamber 220 through the optical system 216. On the fluorescent plate 229, a pattern corresponding to the intensity of the incident electrons appears, which enables measurement of a transmission electron diffraction pattern.

The camera 218 is installed so as to face the fluorescent plate 229 and can take a picture of a pattern appearing in the fluorescent plate 229. An angle formed by a straight line which passes through the center of a lens of the camera 218 and the center of the fluorescent plate 229 and an upper surface of the fluorescent plate 229 is, for example, 15° or more and 80° or less, 30° or more and 75° or less, or 45° or more and 70° or less. As the angle is reduced, distortion of the transmission electron diffraction pattern taken by the camera 218 becomes larger. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of electrons 224. In this case, a transmission electron diffraction pattern with less distortion can be taken from the rear surface of the fluorescent plate 229.

A holder for fixing the substance 228 that is a sample is provided in the sample chamber 214. The holder transmits electrons passing through the substance 228. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 228.

Then, a method for measuring a transmission electron diffraction pattern of a substance by the transmission electron diffraction measurement apparatus described above is described.

For example, changes in the structure of a substance can be observed by changing (or by scanning) the irradiation position of the electrons 224 that are a nanobeam on the substance as illustrated in FIG. 12D. At this time, when the substance 228 is a CAAC-OS film, a diffraction pattern shown in FIG. 12A is observed. When the substance 228 is an nc-OS film, a diffraction pattern shown in FIG. 12B is observed Even when the substance 228 is a CAAC-OS film, a diffraction pattern similar to that of an nc-OS film or the like is partly observed in some cases. Therefore, the quality of the CAAC-OS film can be evaluated by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, higher than or equal to 80%, higher than or equal to 90%, or preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 14A:
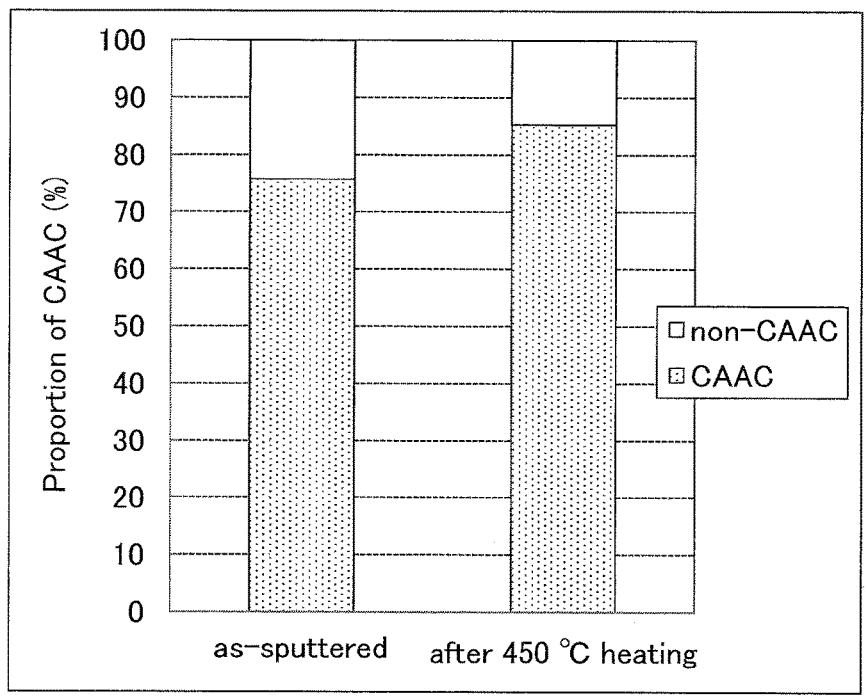
FIG. 14A shows an example of structural analysis by transmission electron diffraction measurement and FIGS. 14B and 14C are high-resolution planar TEM images.

FIG. 14A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 50020 C., the CAAC-OS film can have a high proportion of CAAC.

Here, most of diffraction patterns different from that of a CAAC-OS film are diffraction patterns similar to that of an nc-OS film Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 14B:
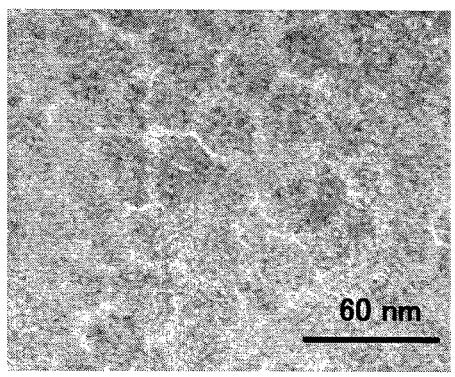
Figure 14C:
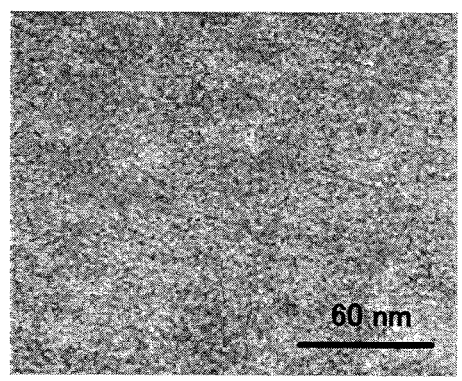

FIGS. 14B and 14C are high-resolution plan-view TEM images of the CAAC-OS film obtained just after the deposition and the CAAC-OS film subjected to the heat treatment at 450° C., respectively. Comparison between FIGS. 14B and 14C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

(Embodiment 4)

In this embodiment, an example of a cross-sectional structure of a transistor used in a memory device included in a semiconductor device of one embodiment of the disclosed invention will be described with reference to FIG. 8A and FIGS. 8B1 to 8B4, FIG. 9, and FIG. 10. In the cross-sectional structure of the transistor described in this embodiment, the transistors M1 to M6, the transistors OM1 and OM2, the capacitors Cp1 and Cp2, and the wirings which are included in the circuit in the memory cell described in Embodiment 2 are shown.

FIG. 8A is a schematic diagram of a layer structure of elements. In FIG. 8A, a first layer 311 is a layer provided with a Si transistor (denoted by SiFET Layer in the drawing). A second layer 312 is a layer provided with a wiring layer (denoted by Wiring Layer in the drawing). A third layer 313 is a layer provided with an OS transistor (denoted by OSFET Layer in the drawing). A fourth layer 314 is a layer provided with a capacitor (denoted by Cp Layer in the drawing).

FIGS. 8B1 to 8B4 are layout diagrams corresponding to the first to fourth layers 311 to 314 in FIG. 8A.

The layout diagram of the fourth layer 314 in FIG. 8B1 corresponds to a layout diagram of the data control line DEL and the capacitors Cp1 and Cp2.

The layout diagram of the third layer 313 in FIG. 8B2 corresponds to a layout diagram of the transistors OM1 and OM2.

The layout diagram of the second layer 312 in FIG. 8B3 corresponds to a layout diagram of the power supply potential line V-VSS, the power supply potential line V-VDM, the bit line BL, and the inverted bit line BLB.

The layout diagram of the first layer 311 in FIG. 8B4 corresponds to a layout diagram of the transistors M1 to M6.

With the structure illustrated in FIG. 8A and FIGS. 8B1 to 8B4, the memory device included in the semiconductor device can achieve a layout of a memory cell capable of backing up/recovering data without increasing in area even when a transistor is added to a normal SRAM including six transistors.

FIG. 9 is a cross-sectional view taken along dashed-dotted line F-F' in FIGS. 8B1 to 8B4, and FIG. 10 is a cross-sectional view taken along dashed-dotted line G-G' in FIGS. 8B1 to 8B4.

FIG. 9 shows a semiconductor substrate 400, an element isolation insulating film 402, a gate insulating layer 410, a gate electrode 412, a gate electrode 414, an interlayer insulating layer 416, a wiring layer 418, a wiring layer 420, a conductive layer 422, an interlayer insulating layer 424, a wiring layer 423, a wiring layer 425, a conductive layer 426, an interlayer insulating layer 428, a wiring layer 430, a wiring layer 432, a wiring layer 434, a wiring layer 436, a wiring layer 438, a wiring layer 440, a conductive layer 444, a wiring layer 446, an interlayer insulating layer 448, a semiconductor layer 452, a gate insulating layer 450, a wiring layer 454, a gate electrode 456, an interlayer insulating layer 458, a conductive layer 460, a conductive layer 462, an insulating layer 464, a conductive layer 466, an interlayer insulating layer 472, a wiring layer 474, a wiring layer 476, an interlayer insulating layer 478, and an interlayer insulating layer 480.

Figure 10:
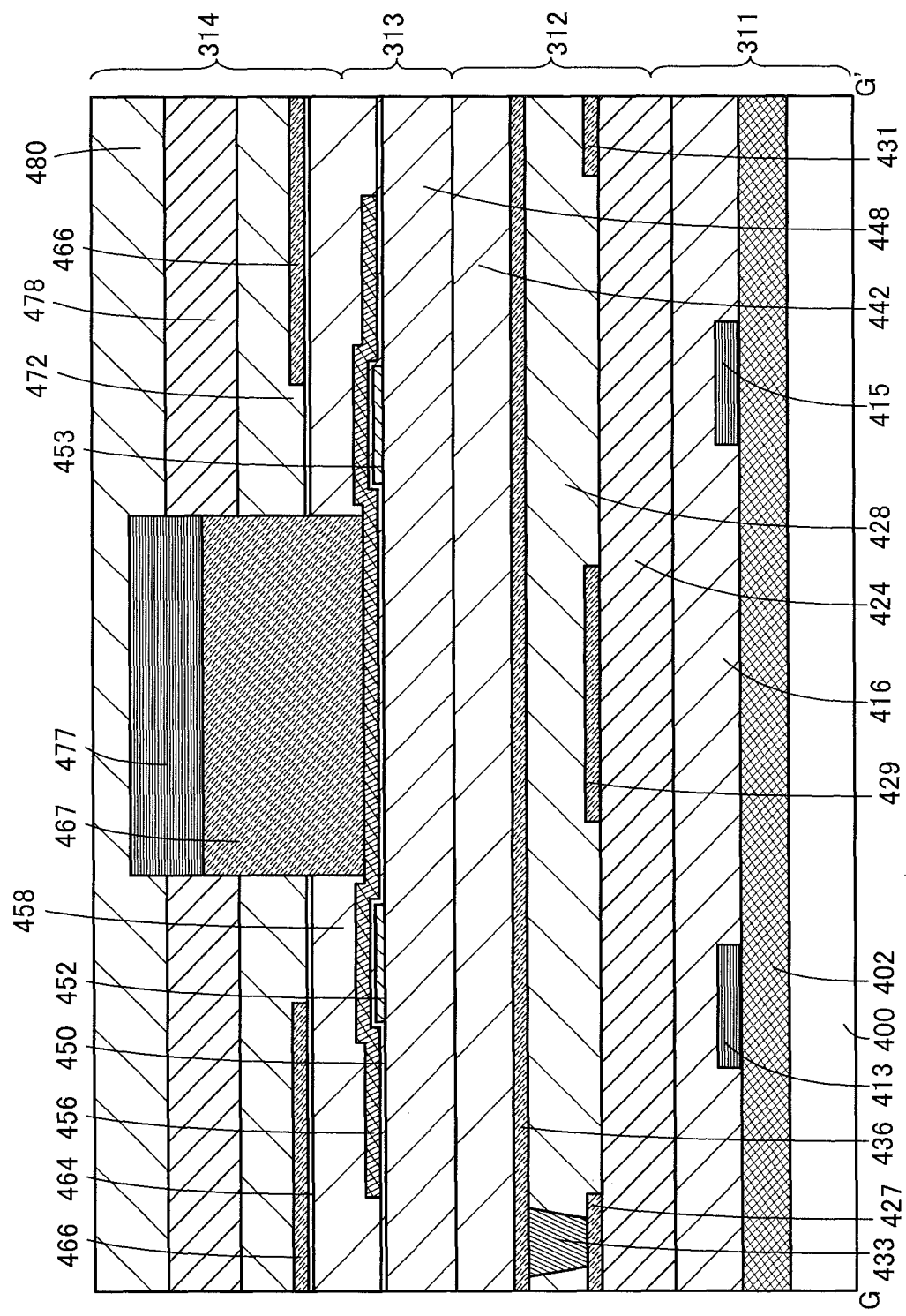
FIG. 10 is a cross-sectional view illustrating one embodiment of the present invention.

FIG. 10 shows the semiconductor substrate 400, the element isolation insulating film 402, a gate electrode 413, a gate electrode 415, the interlayer insulating layer 416, the interlayer insulating layer 424, a wiring layer 427, a wiring layer 429, a wiring layer 431, a conductive layer 433, the interlayer insulating layer 428, the wiring layer 436, an interlayer insulating layer 442, the interlayer insulating layer 448, the semiconductor layer 452, a semiconductor layer 453, the gate insulating layer 450, the gate electrode 456, the interlayer insulating layer 458, the insulating layer 464, the conductive layer 466, the interlayer insulating layer 472, the interlayer insulating layer 478, a conductive layer 467, a wiring layer 477, and the interlayer insulating layer 480.

The semiconductor substrate 400 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor in the first layer 311 is electrically isolated from another transistor by the element isolation insulating film 402. The element isolation insulating film 402 can be formed by a local oxidation of silicon (LOCOS) method, a trench isolation method, or the like.

The gate insulating layer 410 is formed in such a manner that a surface of the semiconductor substrate 400 is oxidized by heat treatment, so that a silicon oxide film is formed, and then the silicon oxide film is selectively etched. Alternatively, the gate insulating layer 410 is formed in such a manner that silicon oxide, silicon oxynitride, a metal oxide such as hafnium oxide, which is a high dielectric constant material (also referred to as a high-k material), or the like is formed by a CVD method, a sputtering method, or the like and then is selectively etched.

Each of the gate electrodes 412, 413, 414, 415, and 456, the wiring layers 418, 420, 423, 427, 429, 430, 431, 432, 434, 436, 438, 440, 446, 454, 474, 476, and 477, and the conductive layers 422, 426, 433, 444, 460, 462, 466, and 467 is preferably formed using a metal material such as aluminum, copper, titanium, tantalum, or tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the interlayer insulating layers 416, 424, 428, 442, 448, 458, 472, 478, and 480 and the insulating layer 464 is preferably a single layer or a multilayer including an inorganic insulating layer or an organic insulating layer. The inorganic insulating layer preferably has a single-layer structure or a layered structure including any of a silicon nitride film, a silicon oxynitride film, a silicon nitride oxide film, and the like. The organic insulating layer is preferably a single layer or a multilayer formed using a polyimide, an acrylic resin, or the like. There is no particular limitation on a method for forming each of the insulating layers; for example, a sputtering method, an MBE method, a PE-CVD method, a pulsed laser deposition method, an atomic layer deposition (ALD) method, or the like can be employed as appropriate.

Each of the semiconductor layers 452 and 453 can be a single layer or a stacked layer formed using an oxide semiconductor. The oxide semiconductor is an oxide containing at least indium, or zinc, such as an In-Ga—Zn-based oxide (also referred to as IGZO). Note that the In—Ga—Zn-based oxide means an oxide containing In, Ga, and Zn, and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an ALD method, an evaporation method, a coating method, or the like.

The gate insulating layer 450 is preferably a single layer or a multilayer including an inorganic insulating layer. The gate insulating layer 450 preferably has an effect of supplying oxygen to the semiconductor layers 452 and 453.

With the structure in FIG. 9 and FIG. 10, the power supply potential line V-VDM and channel formation regions of the transistors OM1 and OM2 can be stacked in the memory device included in the semiconductor device. The power supply potential of the power supply potential line V-VDM is set to a high power supply potential in the case where the power supply voltage is supplied to the memory device. In that case, with the use of the power supply potential line V-VDM for back gates of the transistors OM1 and OM2, on-state currents of the transistors OM1 and OM2 can be increased. In contrast, the power supply potential of the power supply potential line V-VDM is set to a low power supply potential in the case where the power supply voltage is not supplied to the memory device. In that case, with the use of the power supply potential line V-VDM for the back gates of the transistors OM1 and OM2, characteristic such as low off-state currents of the transistors OM1 and OM2 is not inhibited. Therefore, the on-state currents of the transistors OM1 and OM2 can be increased and the off-state currents thereof can be kept low.

Note that the structures, methods, and the like described in this embodiment can be used as appropriate in combination with any of the structures, methods, and the like described in the other embodiments.

(Embodiment 5)

Although the conductive layer and the semiconductor layer described in the above embodiments can be formed by a sputtering method, they may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate.

Deposition by an ALD method may be performed in such a manner that the pressure in a chamber is set to an atmospheric pressure or a reduced pressure, a source gas for reaction and an oxidizer are sequentially introduced into the chamber, and then the sequence of this process is repeated. An inert gas may be introduced, as a carrier gas, simultaneously with the source gas. Two or more kinds of source gases can be used. For example, two or more kinds of source gases are sequentially supplied to the chamber by using switching valves (also referred to as high-speed valves). In this case, a first source gas is introduced, an inert gas (e.g., argon or nitrogen) or the like is introduced after the introduction of the first source gas so that the source gases are not mixed, and then a second source gas is introduced. Alternatively, the first source gas may be exhausted by vacuum evacuation instead of the introduction of the inert gas, and then the second source gas may be introduced. The first source gas is adsorbed on the surface of the substrate and reacted to form a first single-atomic layer; then the second source gas is introduced to absorb on and react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive layer and the semiconductor layer that are described in the above embodiment can be formed by a thermal CVD method such as an MOCVD method or an ALD method. For example, in the case where an $InGaZnO_x$ (X>0) film is formed, trimethylindium ($(CH_3)_3In$), trimethylgallium ($(CH_3)_3Ga$), and dimethylzinc ($(CH_3)_2Zn$) are used. Without limitation to the above combination, triethylgallium ($(C_2H_5)_3Ga$) can be used instead of trimethylgallium and diethylzinc ($(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced to form an initial tungsten film, and then a $WF_6$ gas and an $H_2$ gas are sequentially introduced, so that a tungsten film is formed. Note that an $SiH_4$ gas may be used instead of a $B_2H_6$ gas.

For example, in the case where an oxide semiconductor film, e.g., an $InGaZnO_x$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are sequentially introduced to form a GaO layer, and then a $Zn(CH_3)_2$ gas and an $O_3$ gas are sequentially introduced to form a ZnO layer. Note that the order of these layers is not limited to this example A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling water with an inert gas such as Ar may be used instead of an $O_3$ gas, it is preferable to use an $O_3$ gas which does not contain H.

The structure described in this embodiment can be used in appropriate combination with any of the structures described in the other embodiments.

(Embodiment 6)

In this embodiment, application examples of the memory device described in the above embodiments to an electronic component and to an electronic device including the electronic component are described with reference to FIGS. 15A and 15B and FIGS. 16A to 16E.

Figure 15A:
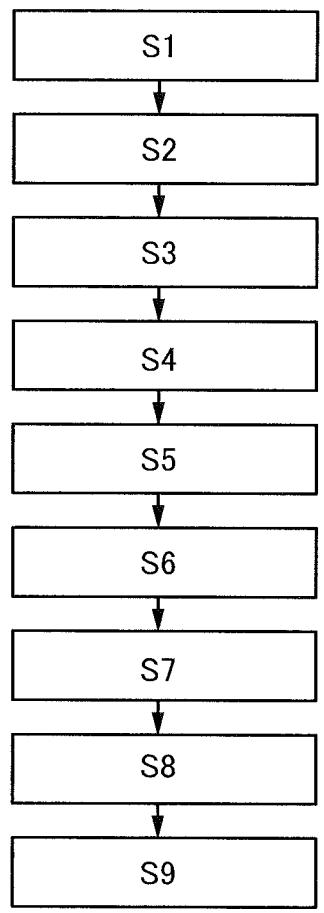
FIG. 15A is a flowchart showing a manufacturing process of an electronic component.

FIG. 15A shows an example where the memory device described in the above embodiments is used to manufacture an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A memory device including the transistors illustrated in FIG. 9 and FIG. 10 in Embodiment 4 is completed by integrating detachable components on a printed circuit board through the assembly process (post-process).

The post-process can be completed through steps shown in FIG. 15A. Specifically, after an element substrate obtained in the preceding process is completed (Step S1), a back surface of the substrate is ground (Step S2). The substrate is thinned in this step to reduce a warp or the like of the substrate in the preceding process and to reduce the size of the component itself After grinding the back surface of the substrate, a dicing step is performed to separate the substrate into a plurality of chips. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above electronic component can include the memory device described in the above embodiments. Thus, the electronic component which achieves reduction in power consumption can be obtained.

Figure 15B:
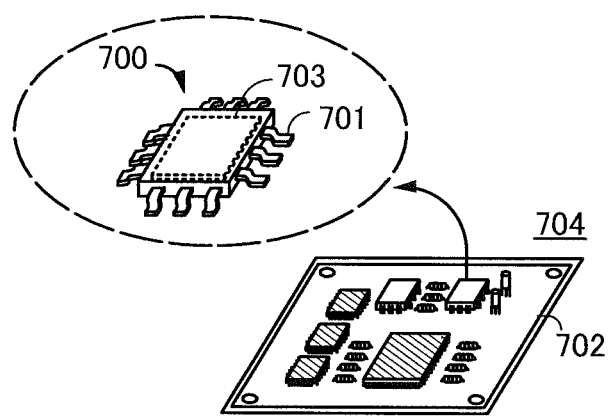
FIG. 15B is a schematic perspective view of the electronic component.

FIG. 15B is a schematic perspective view of the completed electronic component. FIG. 15B is a schematic perspective view illustrating a quad flat package (QFP) as an example of the electronic component. A lead 701 and a circuit portion 703 of an electronic component 700 are illustrated in FIG. 15B. The electronic component 700 in FIG. 15B is, for example, mounted on a printed circuit board 702. When a plurality of electronic components 700 are used in combination and electrically connected to each other over the printed circuit board 702, the electronic components 700 can be mounted on an electronic device. A completed semiconductor device 704 is provided in the electronic device or the like.

Then, applications of the electronic component to an electronic device such as a computer, a portable information terminal (including a mobile phone, a portable game machine, an audio reproducing device, and the like), electronic paper, a television device (also referred to as a television or a television receiver), or a digital video camera are described.

Figure 16A:
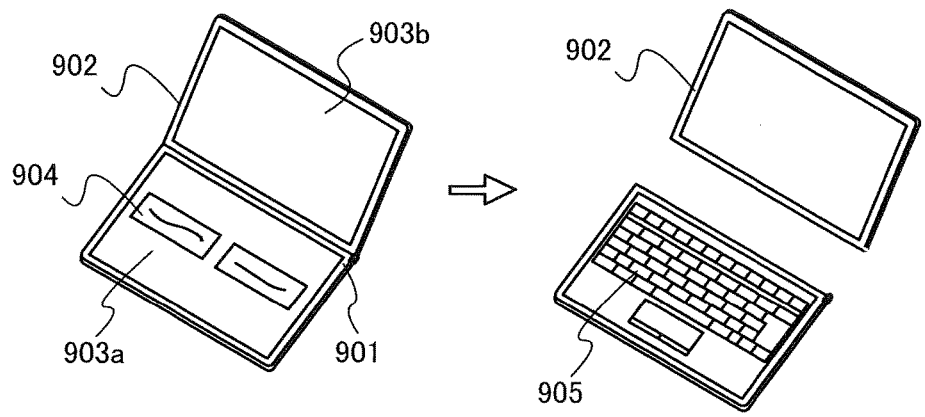
FIGS. 16A to 16E illustrate electronic devices including electronic components.

FIG. 16A illustrates a portable information terminal, which includes a housing 901, a housing 902, a first display portion 903a, a second display portion 903b, and the like. The semiconductor device described in the above embodiments is provided in at least one of the housings 901 and 902. Thus, the portable information terminal which achieves reduction in power consumption can be obtained.

Note that the first display portion 903a is a panel having a touch input function, and for example, as illustrated in the left of FIG. 16A, the "touch input" and the "keyboard input" can be selected by a selection button 904 displayed on the first display portion 903a. Since the selection buttons with a variety of sizes can be displayed, the portable information terminal can be easily used by people of any generation. In the case where the "keyboard input" is selected, for example, a keyboard 905 is displayed on the first display portion 903a as illustrated in the right of FIG. 16A. With the keyboard 905, letters can be input quickly by keyboard input as in the case of using a conventional information terminal, for example.

Furthermore, one of the first display portion 903a and the second display portion 903b can be detached from the portable information terminal as illustrated in the right of FIG. 16A. Providing the second display portion 903b with a touch input function makes the information terminal convenient to carry because the weight can be further reduced and the information terminal can operate with one hand while the other hand supports the housing 902.

The portable information terminal in FIG. 16A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 16A may transmit and receive data wirelessly. Through wireless communication, desired book data or the like can be purchased and downloaded from an electronic book server.

Furthermore, the housing 902 in FIG. 16A may have an antenna, a microphone function, or a wireless communication function to be used as a mobile phone.

Figure 16B:
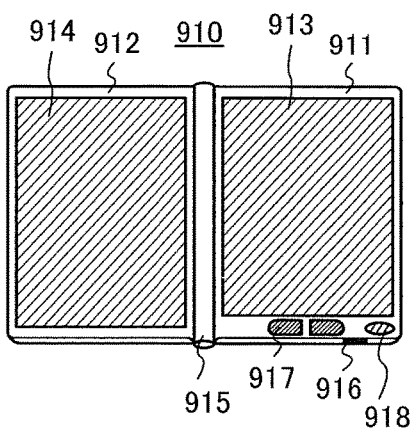

FIG. 16B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened and closed with the hinge portion 915 as an axis. The housing 911 is provided with a power switch 916, an operation key 917, a speaker 918, and the like. The semiconductor device described in the above embodiments is provided in at least one of the housings 911 and 912. Thus, the e-book reader which achieves reduction in power consumption can be obtained.

Figure 16C:
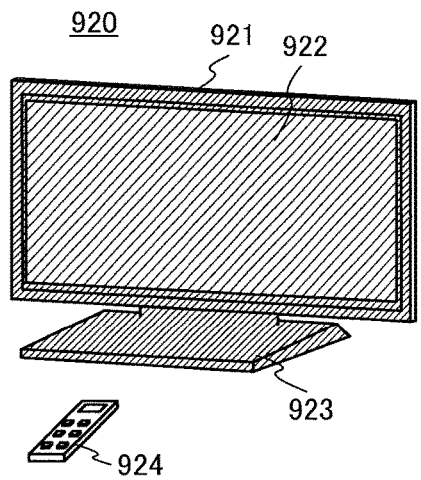

FIG. 16C is a television device, which includes a housing 921, a display portion 922, a stand 923, and the like. The television device 920 can operate with a switch of the housing 921 and a separate remote controller 924. The semiconductor device described in the above embodiments is provided in the housing 921 and the remote controller 924. Thus, the television device which achieves reduction in power consumption can be obtained.

Figure 16D:
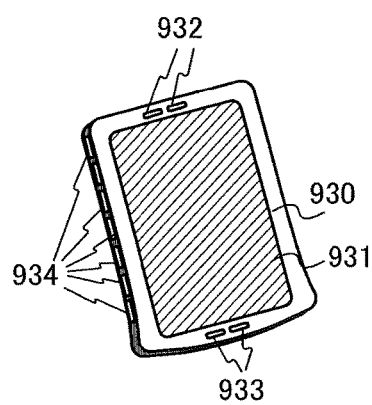

FIG. 16D illustrates a smartphone in which a main body 930 includes a display portion 931, a speaker 932, a microphone 933, operation buttons 934, and the like. The semiconductor device described in the above embodiments is provided in the main body 930. Thus, the smart phone which achieves reduction in power consumption can be obtained.

Figure 16E:
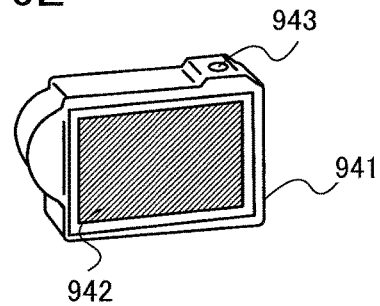

FIG. 16E illustrates a digital camera, which includes a main body 941, a display portion 942, an operation switch 943, and the like. The semiconductor device described in the above embodiments is provided in the main body 941. Thus, the digital camera which achieves reduction in power consumption can be obtained.

As described above, the semiconductor device described in the above embodiments is provided in each of the electronic devices described in this embodiment. Thus, the electronic devices which achieve reduction in power consumption can be obtained.

This application is based on Japanese Patent Application serial no. 2014-057459 filed with Japan Patent Office on Mar. 20, 2014, the entire contents of which are hereby incorporated by reference.

What is claimed is:

1. A semiconductor device comprising:
a memory cell array comprising a memory cell, the memory cell comprising a volatile memory and a nonvolatile memory portion;
a first circuit for writing and reading data in the volatile memory;
a second circuit for backing up the data in the nonvolatile memory portion; and
a third circuit for generating and supplying power supply voltages to the memory cell array, the first circuit, and the second circuit,
wherein a supply of the power supply voltage to the memory cell array is stopped while the first circuit and the second circuit are supplied with the power supply voltages.

2. The semiconductor device according to claim 1,
wherein the memory cell array is configured to undergo power gating while the first circuit and the second circuit are supplied with the power supply voltages.

3. The semiconductor device according to claim 1,
wherein the first circuit and the second circuit are configured to undergo power gating simultaneously with each other and independently from the memory cell array.

4. The semiconductor device according to claim 1,
wherein a supply of the power supply voltages to the first circuit and the second circuit is stopped after stopping the supply of the power supply voltage to the memory cell array.

5. The semiconductor device according to claim 1,
wherein the third circuit is configured to undergo power gating to stop generating the power supply voltages.

6. The semiconductor device according to claim 1,
wherein the volatile memory comprises a transistor including silicon in a channel region, and
wherein the nonvolatile memory portion comprises a transistor having an oxide semiconductor in a channel region.

7. An electronic device comprising the semiconductor device according to claim 1.

8. A semiconductor device comprising:
a memory cell array comprising a memory cell, the memory cell comprising a volatile memory and a nonvolatile memory portion;
a first circuit for writing and reading data in the volatile memory;
a second circuit for backing up the data in the nonvolatile memory portion;
a third circuit for generating and supplying power supply voltages to the memory cell array, the first circuit, and the second circuit,
a first switch connecting the memory cell to the third circuit;
a second switch connecting the first circuit to the third circuit;
a third switch connecting the second circuit to the third circuit; and
a fourth circuit for controlling on and off of the first to third switches,
wherein the fourth circuit is configured to turn off the first switch while the second and third switches are turned on.

9. The semiconductor device according to claim 8,
wherein the memory cell array is configured to undergo power gating while the first circuit and the second circuit are supplied with the power supply voltages.

10. The semiconductor device according to claim 8,
wherein the first circuit and the second circuit are configured to undergo power gating simultaneously with each other and independently from the memory cell array.

11. The semiconductor device according to claim 8,
wherein the fourth circuit is configured to turn off the second and third switches after turning off the first switch.

12. The semiconductor device according to claim 8,
wherein the third circuit is configured to undergo power gating to stop generating the power supply voltages.

13. The semiconductor device according to claim 8,
wherein the volatile memory comprises a transistor including silicon in a channel region, and
wherein the nonvolatile memory portion comprises a transistor having an oxide semiconductor in a channel region.

14. An electronic device comprising the semiconductor device according to claim 8.

15. A method for driving a semiconductor device, the method comprising:
writing data to a volatile memory by a first circuit, wherein a memory cell array comprising a memory cell comprising the volatile memory and a nonvolatile memory portion;
backing up the data stored in the volatile memory to the nonvolatile memory portion by a second circuit;
supplying power supply voltages from a third circuit to the memory cell array, the first circuit, and the second circuit; and
stopping a supply of the power supply voltage to the memory cell array while the first circuit and the second circuit are supplied with the power supply voltages.

16. The method according to claim 15,
wherein the memory cell array is configured to undergo power gating while the first circuit and the second circuit are supplied with the power supply voltages.

17. The method according to claim 15,
wherein the first circuit and the second circuit are configured to undergo power gating simultaneously with each other and independently from the memory cell array.

18. The method according to claim 15, further comprising:
stopping a supply of the power supply voltages to the first circuit and the second circuit after stopping the supply of the power supply voltage to the memory cell array.

19. The method according to claim 15,
wherein the third circuit is configured to undergo power gating to stop generating the power supply voltages.

20. A method for driving a semiconductor device, the method comprising:
writing data to a volatile memory from a first circuit, wherein a memory cell array comprising a memory cell comprising the volatile memory and a nonvolatile memory portion;
backing up the data stored in the volatile memory to the nonvolatile memory portion by a second circuit;
supplying power supply voltages from a third circuit to the memory cell array through a first switch, the first circuit through a second switch, and the second circuit through a third switch; and turning off the first switch while the second and third switches are turned on.

21. The method according to claim 20, wherein the memory cell array is configured to undergo power gating while the first circuit and the second circuit are supplied with the power supply voltages.

22. The method according to claim 20, wherein the first circuit and the second circuit are configured to undergo power gating simultaneously with each other and independently from the memory cell array.

23. The method according to claim 20, further comprising:
turning off the second and third switches after turning off the first switch.

24. The method according to claim 20, wherein the third circuit is configured to undergo power gating to stop generating the power supply voltages.

* * * * *